US011422156B2

(12) United States Patent
Hironaka et al.

(10) Patent No.: US 11,422,156 B2
(45) Date of Patent: Aug. 23, 2022

(54) CONTACT PROBE AND PROBE UNIT

(71) Applicant: NHK Spring Co., Ltd., Yokohama (JP)

(72) Inventors: Kohei Hironaka, Kanagawa (JP); Kazuya Soma, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 0 days.

(21) Appl. No.: 16/633,597

(22) PCT Filed: Jul. 26, 2018

(86) PCT No.: PCT/JP2018/028136
§ 371 (c)(1),
(2) Date: Jan. 24, 2020

(87) PCT Pub. No.: WO2019/022204
PCT Pub. Date: Jan. 31, 2019

(65) Prior Publication Data
US 2021/0156887 A1 May 27, 2021

(30) Foreign Application Priority Data

Jul. 28, 2017 (JP) .............................. JP2017-146975

(51) Int. Cl.
G01R 1/073 (2006.01)
G01R 1/04 (2006.01)
G01R 1/067 (2006.01)

(52) U.S. Cl.
CPC ........... *G01R 1/073* (2013.01); *G01R 1/0466* (2013.01); *G01R 1/06722* (2013.01)

(58) Field of Classification Search
CPC ... G01R 1/073; G01R 1/0466; G01R 1/06722
See application file for complete search history.

(56) References Cited

U.S. PATENT DOCUMENTS

| 6,337,572 | B1 | 1/2002 | Kazama |
| 7,470,149 | B2 | 12/2008 | Kazama et al. |
| 7,785,147 | B2 | 8/2010 | Nakayama et al. |
| 10,161,964 | B2 | 12/2018 | Miyagawa |
| 2003/0126735 | A1* | 7/2003 | Taniguchi ............. G01R 31/69 29/593 |

(Continued)

FOREIGN PATENT DOCUMENTS

| CN | 1875281 A | 12/2006 |
| JP | S60-082271 U | 6/1985 |

(Continued)

OTHER PUBLICATIONS

International Search Report dated Oct. 23, 2018, issued for PCT/JP2018/028136.

(Continued)

*Primary Examiner* — Paresh Patel
(74) *Attorney, Agent, or Firm* — Locke Lord LLP

(57) ABSTRACT

A contact probe includes: a cylindrical pipe member; a collar including a hollow portion and fixed to an inner circumferential side of at least one end in a longitudinal direction of the pipe member; and an inner conductor including a flange configured to abut on a stepped portion formed by the pipe member and the collar, the inner conductor being expandable and contractible along the longitudinal direction and penetrating the pipe member.

8 Claims, 13 Drawing Sheets

(56) References Cited

U.S. PATENT DOCUMENTS

| | | | | |
|---|---|---|---|---|
| 2004/0100295 A1* | 5/2004 | Lee | ................... | G01R 1/06772 |
| | | | | 324/755.02 |
| 2007/0111560 A1* | 5/2007 | Kazama | ............... | G01R 1/0483 |
| | | | | 439/71 |
| 2009/0093161 A1* | 4/2009 | Kazama | ............... | G01R 1/0483 |
| | | | | 439/620.01 |
| 2016/0154024 A1* | 6/2016 | Miyagawa | ............. | G01R 1/045 |
| | | | | 324/755.11 |

FOREIGN PATENT DOCUMENTS

| | | | |
|---|---|---|---|
| JP | 2005-009925 | A | 1/2005 |
| JP | 2005-127891 | A | 5/2005 |
| JP | 2007-178163 | A | 7/2007 |
| JP | 2007-178196 | A | 7/2007 |
| JP | 2010-197402 | A | 9/2010 |
| JP | 2016-070863 | A | 5/2016 |
| JP | 2016-102696 | A | 6/2016 |
| WO | 99/04274 | A1 | 1/1999 |

OTHER PUBLICATIONS

Office Action dated Feb. 18, 2022, issued for Chinese Patent Application No. 201880048520.6 w/ English translation of cover page and Search Report.

* cited by examiner

CONTACT PROBE AND PROBE UNIT

FIELD

The present invention relates to a contact probe and a probe unit.

BACKGROUND

Conventionally, in a technical field related to an electrical characteristics inspection of a semiconductor integrated circuit (IC), a technology is known related to a probe unit in which a plurality of contact probes (hereinafter, simply called probes) are arranged corresponding to external connection electrodes of the semiconductor IC. The probe unit includes the probes and a probe holder in which hole portions for accommodating the probes are formed (refer, for example, to Patent Literature 1).

In the probe unit, a signal probe for receiving and outputting an electrical signal from and to the semiconductor IC, a power supply probe for supplying power, and a grounding probe for supplying a ground potential are used as the above-mentioned probes. The signal probe, the power supply probe, and the grounding probe may have different outside diameters according to the functions thereof. In Patent Literature 1, the probe holder is provided with an insulating block in which holes corresponding to the diameters of the respective probes and forming a part of the above-mentioned hole portions are formed corresponding to the arrangement of the probes. In the probe holder, the arrangement of the various probes can be changed by providing the insulating block corresponding to the arrangement of the external connection electrodes of the semiconductor IC used.

CITATION LIST

Patent Literature

Patent Literature 1: Japanese Patent Application Laid-open No. 2016-70863

SUMMARY

Technical Problem

However, in the technique disclosed in Patent Literature 1, the insulating block with corresponding holes formed therein has to be prepared each time the arrangement of the external connection electrodes of the semiconductor IC is changed to different one. As a result, the number of insulating blocks increases with increase in number of arrangement patterns of the external connection electrodes of the semiconductor IC that can be used.

The present invention has been made in view of the above, and it is an object thereof to provide a contact probe and a probe unit capable of simplifying configuration of a probe holder in which the arrangement of the contact probes is changeable.

Solution to Problem

To solve the above-described problem and achieve the object, a contact probe according to the present invention includes: a cylindrical pipe member; a collar including a hollow portion and fixed to an inner circumferential side of at least one end in a longitudinal direction of the pipe member; and an inner conductor including a flange configured to abut on a stepped portion formed by the pipe member and the collar, the inner conductor being expandable and contractible along the longitudinal direction and penetrating the pipe member.

Moreover, in the above-described contact probe according to the present invention, the pipe member includes an insulating pipe made of an insulating material.

Moreover, in the above-described contact probe according to the present invention, the pipe member further includes conductive coating layers provided on an inner circumference and an outer circumference of the insulating pipe.

Moreover, in the above-described contact probe according to the present invention, the pipe member is made of a conductive material.

Moreover, in the above-described contact probe according to the present invention, the pipe member includes: an outer circumferential pipe and an inner circumferential pipe forming a double-pipe structure; and insulating members provided between the outer circumferential pipe and the inner circumferential pipe at both ends in an axial direction of the pipe member, and an air layer is formed by the outer circumferential pipe, the inner circumferential pipe, and the insulating members.

Moreover, in the above-described contact probe according to the present invention, the collar is made of a conductive material.

Moreover, in the above-described contact probe according to the present invention, the collar is provided at each of both ends of the pipe member.

Moreover, a probe unit according to the present invention includes: a signal probe configured to receive and output a signal from and to a predetermined circuit structure; a power supply probe configured to supply power to the predetermined circuit structure; a grounding probe configured to supply a ground potential to the predetermined circuit structure; and a conductive probe holder including a plurality of hole portions in which the signal probe, the power supply probe, and the grounding probe are insertable, the plurality of hole portions having a same hole shape as one another, wherein each of the signal probe, the power supply probe, and the grounding probe includes: a cylindrical pipe member; a collar including a hollow portion and fixed to an inner circumferential side of at least one end in a longitudinal direction of the pipe member; and an inner conductor including a flange configured to abut on a stepped portion formed by the pipe member and the collar, the inner conductor being expandable and contractible along the longitudinal direction and penetrating the pipe member, and the pipe members of the probes have a same outer diameter.

Moreover, in the above-described probe unit according to the present invention, adjacent ones of the hole portions of the probe holder communicate with each other at portions thereof, at least an outer circumferential surface of the pipe member is conductive, and the pipe members of the probes penetrating the adjacent hole portions contact each other at the portions where the hole portions communicate with each other.

Advantageous Effects of Invention

The present invention provides an effect that, in a probe holder in which contact probes are changeable in arrangement, the probe holder can be simplified in configuration.

DESCRIPTION OF EMBODIMENTS

Figure 1:
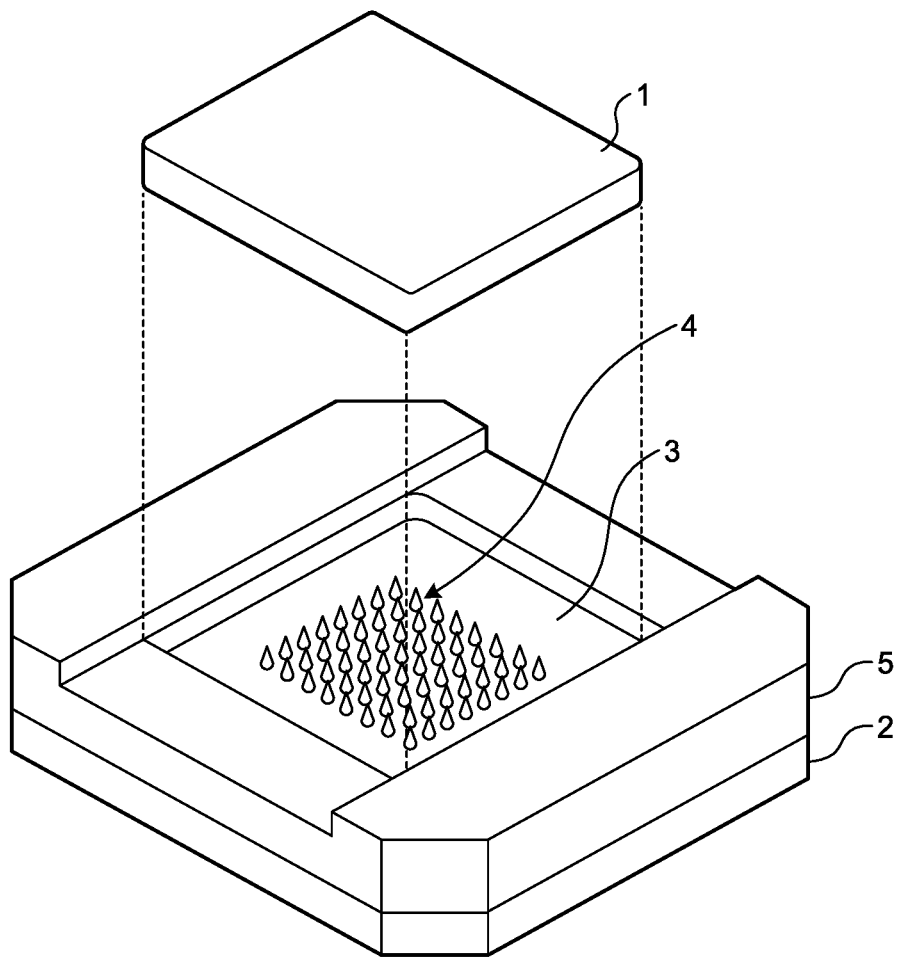
FIG. 1 is a schematic view illustrating an overall configuration of a probe unit according to a first embodiment of the present invention.

Embodiments for carrying out the present invention will be described below in detail together with the accompanying drawings. The present invention is not limited by the following embodiments. The same parts illustrated in the drawings are denoted by the same reference signs. The drawings to be referred to in the following description merely schematically illustrate shapes, sizes, and positional relations to an extent sufficient to allow the details of the present invention to be understood. Accordingly, the present invention is not limited to only the shapes, sizes and positional relations illustrated in the drawings.

First Embodiment

A probe unit according to a first embodiment of the present invention is a component for receiving and outputting electrical signals from and to a predetermined circuit structure, such as a semiconductor integrated circuit (IC), and for supplying power and a ground potential thereto, and, in particular, to stably supply the ground potential, has a configuration in which grounding probes for supplying the ground potential are electrically connected to a probe holder made of a conductive material.

FIG. 1 is a schematic view illustrating a structure of a probe unit according to the first embodiment of the present invention. As illustrated in FIG. 1, the probe unit according to the first embodiment includes a circuit substrate 2 including a circuit for, for example, generating signals to be supplied to a semiconductor integrated circuit (IC) 1, a probe holder 3 disposed on the circuit substrate 2 and including predetermined hole portions (not illustrated in FIG. 1), and contact probes 4 (hereinafter, the contact probes are simply called "probes") accommodated in the hole portions of the probe holder 3. A holder member 5 for restraining the semiconductor IC 1 in use from being displaced is disposed on the circuit substrate 2 at an outer periphery of the probe holder 3.

The circuit substrate 2 includes an inspection circuit for inspecting electrical characteristics of the semiconductor IC 1 to be inspected. The circuit substrate 2 has a configuration in which electrodes (not illustrated in FIG. 1) for electrically connecting a built-in circuit to the probes 4 are arranged on a contact surface with the probe holder 3.

The probe holder 3 is a component for accommodating the probes 4. Specifically, the probe holder 3 includes a holder substrate made of a conductive material, such as a metal. The holder substrate has a structure in which the hole portions (holder holes) are formed in areas thereof corresponding to arrangement locations of the probes 4, and the hole portions accommodate the probes 4.

The probes 4 are components for electrically connecting the circuit included in the circuit substrate 2 to the semiconductor IC 1. The probes 4 are broadly divided into three patterns according to, for example, types of signals to be supplied to the semiconductor IC 1, and specifically include signal probes for receiving and outputting the electrical signals from and to the semiconductor IC 1, power supply probes for supplying the power to the semiconductor IC 1, and the grounding probes for supplying the ground potential to the semiconductor IC 1. Hereinafter, each of the signal probes, the grounding probes, and the power supply probes will be called "probe" when collectively called, and will be called using the individual name when individually mentioned.

Figure 2:
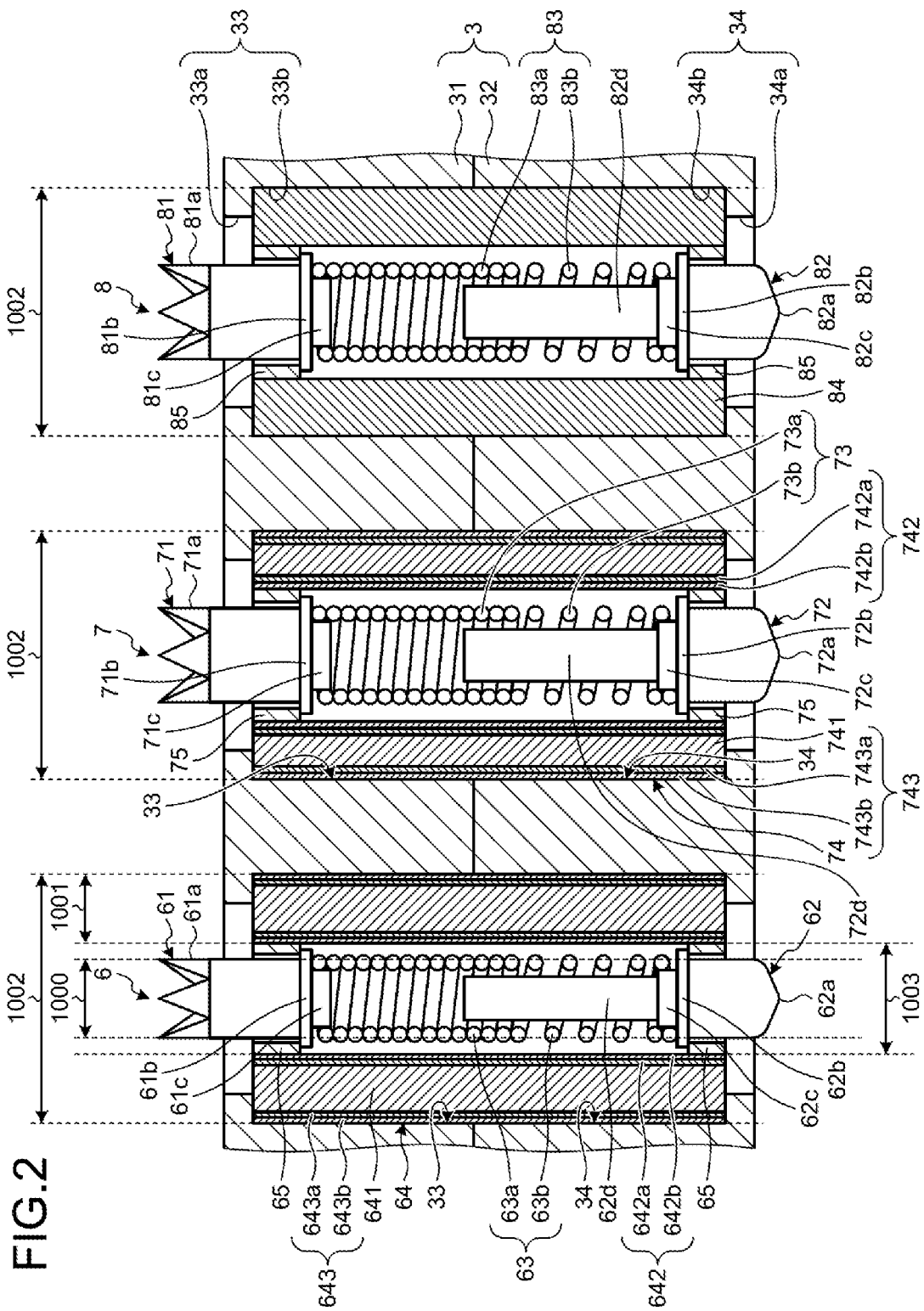
FIG. 2 is a partial sectional view illustrating a detailed structure of a probe holder and probes constituting the probe unit according to the first embodiment of the present invention.

FIG. 2 is a partial sectional view illustrating a detailed configuration of the probe holder and the probes. As illustrated in FIG. 2, the probe holder 3 is laminated with a first member 31 located on an upper surface side and a second member 32 located on a lower surface side in FIG. 2. The first member 31 is fixed to the second member 32, for example, using an adhesive material such as a resin or by screwing. In the present specification, a coaxial structure refers to a coincident axial structure in which the central axis of the signal probe coincides with the central axis of an inner surface of each of the hole portions. The configuration of the probe holder 3 will be described later.

The following describes structures of the probes. The following describes the structures of the respective probes in the order of a signal probe 6, a power supply probe 7, and a grounding probe 8.

The signal probe 6 includes a first plunger 61 that contacts an inspection signal electrode of the semiconductor IC 1 when the semiconductor IC 1 is inspected, a second plunger 62 that contacts an electrode of the circuit substrate 2 including the inspection circuit, a coil spring 63 that is provided between the first plunger 61 and the second plunger 62 and connects the first plunger 61 to the second plunger 62 in an expandable and contractible manner, a first pipe member 64 that accommodates portions of the first plunger 61 and the second plunger 62 and accommodates the coil spring 63, and collars 65 provided at both ends of the first pipe member 64. The first plunger 61, the second plunger 62, and the coil spring 63 have the same axis line. When the signal probe 6 contacts the semiconductor IC 1, the coil spring 63 expands and contracts in the axis line direction to reduce impact on a contact electrode of the semiconductor IC 1 and apply a load to the semiconductor IC 1 and the circuit substrate 2. A thickness 1001 of the first pipe member 64 is indicated in FIG. 2.

The first plunger 61 is made of, for example, a conductive material, such as a metal. The first plunger 61 coaxially includes a distal end 61*a* having a shape of tapered ends, a flange 61*b* extending from a proximal end side of the distal end 61*a* and having a diameter larger than that of the distal end 61*a*, and a boss 61*c* extending from an end of the flange 61*b* different from that on a side thereof continuing to the distal end 61*a* and having a diameter smaller than that of the flange 61*b*. The distal end 61*a* has a crown shape. The distal end 61*a* and the flange 61*b* form a stepped portion on the first plunger 61. The distal end and the flange also form a stepped portion in configurations given below.

The second plunger 62 is made of, for example, a conductive material, such as a metal. The second plunger 62 coaxially includes a distal end 62*a* having a shape of a tapered end, a flange 62*b* extending from a proximal end side of the distal end 62*a* and having a diameter larger than that of the distal end 62*a*, a boss 62*c* extending from an end of the flange 62*b* different from that on a side thereof continuing to the distal end 62*a* and having substantially the same diameter as that of the boss 61*c*, and a proximal end 62*d* extending from an end of the boss 62*c* different from that on a side thereof continuing to the flange 62*b* and having a diameter slightly smaller than that of the bosses 61*c* and 62*c*. The second plunger 62 is movable in the axis line direction by the expansion/contraction action of the coil spring 63, and is urged in a direction toward the circuit substrate 2 by an elastic force of the coil spring 63 to contact the electrode of the circuit substrate 2.

The distal end 61*a* of the first plunger 61 may have a conical shape, and the distal end 62*a* of the second plunger 62 may have a crown shape. The distal ends 61*a* and 62*a* can each be changed in shape according to a contact target.

A wire rod made of, for example, a metal, a resin, or a material obtained by coating a metal surface with a resin is used as the coil spring 63. The first plunger 61 side of the coil spring 63 serves as a solid coil portion 63*a* wound with substantially the same inside diameter as the diameter of the boss 61*c*, while the second plunger 62 side of the coil spring 63 serves as a coarse coil portion 63*b* wound at a predetermined pitch with an inside diameter equal to or larger than the diameter of the proximal end 62*d*. An end of the solid coil portion 63*a* is, for example, press-fitted onto the boss 61*c*, and abuts on the flange 61*b*. An end of the coarse coil portion 63*b* is press-fitted onto the boss 62*c*, and abuts on the flange 62*b*.

In the present specification, the configuration in which the first plunger and the second plunger are connected to the coil spring corresponds to an inner conductor in the probe. An outermost diameter 1000 of the inner conductor indicated in FIG. 2.

The first pipe member 64 has a cylindrical shape in which the first plunger 61, the second plunger 62, and the coil spring 63 are insertable. The first pipe member 64 includes an impedance correction member 641 for correcting a value of characteristic impedance of the signal probe. 6, an inner circumferential plating 642 provided on an inner circumference of the impedance correction member 641, and an outer circumferential plating 643 provided on an outer circumference of the impedance correction member 641.

The impedance correction member 641 is a member obtained by forming a dielectric material having a predetermined dielectric constant into a cylindrical shape, and is an insulating member for correcting the value of the characteristic impedance of the signal probe 6. Specifically, the impedance correction member 641 is adjusted in the dielectric constant of the dielectric material and the outside diameter of the cylindrical shape, and as a result, corrects the characteristic impedance of the signal probe 6 so as to be equal to, for example, a generally employed value of 50 ohms. The impedance correction member 641 is made of, for example, an insulating material such as polytetrafluoroethylene.

The inner circumferential plating 642 is a conductive coating layer provided on the inner circumference of the impedance correction member 641. The inner circumferential plating 642 includes a first plating 642*a* provided on the inner circumference of the impedance correction member 641 and a second plating 642*b* that covers the first plating 642*a*. The first plating 642*a* is formed of, for example, nickel. The second plating 642*b* is formed of, for example, gold.

The outer circumferential plating 643 is a conductive coating layer provided on the outer circumference of the impedance correction member 641. The outer circumferential plating 643 includes a first plating 643*a* provided on the outer circumference of the impedance correction member 641 and a second plating 643*b* that covers the first plating 643*a*. The first plating 643*a* is formed of, for example, nickel. The second plating 643*b* is formed of, for example, gold.

While the first pipe member 64 is subjected to the plating treatment of two layers, the number of layers may be one, or multiple, such as three or more. Such plating treatment is applied to form the conductive layers on the first pipe member 64.

Each of the collars 65 is made of, for example, a conductive material, such as a metal, and has a hollow cylindrical shape. The outer circumference of the collar 65 has a diameter that can be press-fitted or fixed into the inner circumference of the first pipe member 64. The inner circumference (hollow portion) of the collar 65 has a diameter equal to or slightly larger than the diameter of the distal end of one of the first plunger 61 and the second plunger 62 inserted in the collar 65. The collars 65 are provided at both ends of the first pipe member 64, and form stepped portions in conjunction with the inner circumferential surface of the first pipe member 64. The flange 61*b* of the first plunger 61 and the flange 62*b* of the second plunger 62 abut on the stepped portions to be prevented from coming off of the first pipe member 64. The collars 65 are press-fitted to be fixed to the inner circumference of the first pipe member 64, or fixed to the inner circumference of the first pipe member 64 by soldering or with an adhesive.

The power supply probe 7 includes a first plunger 71 that contacts a power supply electrode of the semiconductor IC 1 when the semiconductor IC 1 is inspected, a second plunger 72 that contacts an electrode of the circuit substrate 2 including the inspection circuit, a coil spring 73 that is provided between the first plunger 71 and the second plunger 72 and connects the first plunger 71 to the second plunger 72 in an expandable and contractible manner, a second pipe member 74 that accommodates portions of the first plunger 71 and the second plunger 72 and accommodates the coil spring 73, and collars 75 provided at both ends of the second pipe member 74. The first plunger 71, the second plunger 72, and the coil spring 73 have the same axis line.

The first plunger 71 is made of, for example, a conductive material, such as a metal. The first plunger 71 coaxially includes a distal end 71a having a shape of tapered ends, a flange 71b extending from a proximal end side of the distal end 71a and having a diameter larger than that of the distal end 71a, and a boss 71c extending from an end of the flange 71b different from that on a side thereof continuing to the distal end 71a and having a diameter smaller than that of the flange 71b. The distal end 71a has a crown shape.

The second plunger 72 is made of, for example, a conductive material, such as a metal. The second plunger 72 coaxially includes a distal end 72a having a shape of a tapered end, a flange 72b extending from a proximal end side of the distal end 72a and having a diameter larger than that of the distal end 72a, a boss 72c extending from an end of the flange 72b different from that on a side thereof continuing to the distal end 72a and having substantially the same diameter as that of the boss 71c, and a proximal end 72d extending from an end of the boss 72c different from that on a side thereof continuing to the flange 72b and having a diameter slightly smaller than that of the bosses 71c and 72c. The second plunger 72 is movable in the axis line direction by the expansion/contraction action of the coil spring 73, and is urged in a direction toward the circuit substrate 2 by an elastic force of the coil spring 73 to contact the electrode of the circuit substrate 2.

In the same way as the distal ends 61a and 62a, the distal ends 71a and 72a are not limited in shape, and can each be changed in shape according to the contact target.

A wire rod made of, for example, a metal, a resin, or a material obtained by coating a metal surface with a resin is used as the coil spring 73. The first plunger 71 side of the coil spring 73 serves as a solid coil portion 73a wound with substantially the same inside diameter as the diameter of the boss 71c, while the second plunger 72 side of the coil spring 73 serves as a coarse coil portion 73b wound at a predetermined pitch with an inside diameter equal to or larger than the diameter of the proximal end 72d. An end of the solid coil portion 73a is, for example, press-fitted onto the boss 71c, and abuts on the flange 71b. An end of the coarse coil portion 73b is press-fitted onto the boss 72c, and abuts on the flange 72b.

The second pipe member 74 has a cylindrical shape in which the first plunger 71, the second plunger 72, and the coil spring 73 are insertable. The second pipe member 74 includes an insulating member 741 made of an insulating material, an inner circumferential plating 742 provided on an inner circumference of the insulating member 741, and an outer circumferential plating 743 provided on an outer circumference of the insulating member 741.

The insulating member 741 is a member obtained by forming the insulating material into a cylindrical shape. Specifically, the insulating member 741 is formed of the insulating material, such as ceramic or polytetrafluoroethylene.

The inner circumferential plating 742 includes a first plating 742a provided on the inner circumference of the insulating member 741 and a second plating 742b that covers the first plating 742a. The first plating 742a is formed of, for example, nickel. The second plating 742b is formed of, for example, gold.

The outer circumferential plating 743 includes a first plating 743a provided on the outer circumference of the insulating member 741 and a second plating 743b that covers the first plating 743a. The first plating 743a is formed of, for example, nickel. The second plating 743b is formed of, for example, gold.

While the second pipe member 74 is subjected to the plating treatment of two layers, the number of layers may be one, or multiple, such as three or more.

Each of the collars 75 is made of, for example, a conductive material, such as a metal, and has a hollow cylindrical shape. The outer circumference of the collar 75 has a diameter that can be press-fitted or fixed into the inner circumference of the second pipe member 74. The inner circumference of the collar 75 has a diameter equal to or slightly larger than the diameter of the distal end of one of the first plunger 71 and the second plunger 72 inserted in the collar 75. The collars 75 are provided at both ends of the second pipe member 74, and form stepped portions in conjunction with the inner circumferential surface of the second pipe member 74. The flange 71b of the first plunger 71 and the flange 72h of the second plunger 72 abut on the stepped portions to be prevented from coming off of the second pipe member 74.

The grounding probe 8 includes a first plunger 81 that contacts a grounding electrode of the semiconductor IC 1 when the semiconductor IC 1 is inspected, a second plunger 82 that contacts an electrode of the circuit substrate 2 including the inspection circuit, a coil spring 83 that is provided between the first plunger 81 and the second plunger 82 and connects the first plunger 81 to the second plunger 82 in an expandable and contractible manner, a third pipe member 84 that accommodates portions of the first plunger 81 and the second plunger 82 and accommodates the coil spring 83, and collars 85 provided at both ends of the third pipe member 84. The first plunger 81, the second plunger 82, and the coil spring 83 have the same axis line.

The first plunger 81 is made of, for example, a conductive material, such as a metal. The first plunger 81 coaxially includes a distal end 81a having a shape of tapered ends, a flange 81b extending from a proximal end side of the distal end 81a and having a diameter larger than that of the distal end 81a, and a boss 81c extending from an end of the flange 81b different from that on a side thereof continuing to the distal end 81a and having a diameter smaller than that of the flange 81b. The distal end 81a has a crown shape.

The second plunger 82 is made of, for example, a conductive material, such as a metal. The second plunger 82 coaxially includes a distal end 82a having a shape of a tapered end, a flange 82h extending from a proximal end side of the distal end 82a and having a diameter larger than that of the distal end 82a, a boss 82c extending from an end of the flange 82b different from that on a side thereof continuing to the distal end 82a and having substantially the same diameter as that of the boss 81c, and a proximal end. 82d extending from an end of the boss 82c different from that on a side thereof continuing to the flange 82b and having a diameter slightly smaller than that of the bosses 81c and 82c. The second plunger 82 is movable in the axis line direction by the expansion/contraction action of the coil spring 83, and is urged in a direction toward the circuit substrate 2 by an elastic force of the coil spring 83 to contact the electrode of the circuit substrate 2.

In the same way as the distal ends 61a and 62a, the distal ends 81a and 82a are not limited in shape, and can each be changed in shape according to the contact target.

A wire rod made of, for example, a metal, a resin, or a material obtained by coating a metal surface with a resin is used as the coil spring 83. The first plunger 81 side of the coil spring 83 serves as a solid coil portion 83a wound with substantially the same inside diameter as the diameter of the boss 81c, while the second plunger 82 side of the spring 83 serves as a coarse coil portion 83b wound at a predetermined pitch with an inside diameter equal to or larger than the diameter of the proximal end 82d. An end of the solid coil portion 83a is, for example, press-fitted onto the boss 81c, and abuts on the flange 81b. An end of the coarse coil portion 83b is press-fitted onto the boss 82c, and abuts on the flange 82b.

The third pipe member 84 has a cylindrical shape in which the first plunger 81, the second plunger 82, and the coil spring 83 are insertable. The third pipe member 84 is made of a conductive material, such as a metal. The outer circumferential surface and the inner circumferential surface of the third pipe member 84 may be plated.

Each of the collars 85 is made of, for example, a conductive material, such as a metal, and has a hollow cylindrical shape. The outer circumference of the collar 85 has a diameter that can be press-fitted or fixed into the inner circumference of the third pipe member 84. The inner circumference of the collar 85 has a diameter equal to or slightly larger than the diameter of the distal end of one of the first plunger 81 and the second plunger 82 inserted in the collar 85. The collars 85 are provided at both ends of the third pipe member 84, and form stepped portions in conjunction with the inner circumferential surface of the third pipe member 84. The flange 81b of the first plunger 81 and the flange 82b of the second plunger 82 abut on the stepped portions to be prevented from coming off of the third pipe member 84.

In the first embodiment, the diameters of the outer circumferences of the first pipe member 64, the second pipe member 74, and the third pipe member 84 are the same as one another.

As described above, the probe holder 3 is laminated with the first member 31 and the second member 32. The first member 31 and the second member 32 are each made of, for example, a conductive material, such as a metal. The first member 31 and the second member 32 are provided with the same numbers of holder holes 33 and 34, respectively, serving as the hole portions for accommodating the probes 4. The holder holes 33 and 34 for accommodating the probes 4 are formed such that the axis lines of each of the holder holes 33 and corresponding one of the holder holes 34 coincide with each other. The holder holes 33 and 34 are formed in positions covering all possible wiring patterns in the semiconductor IC 1 to be inspected. In addition to the metal, any conductive materials are applicable as the first member 31 and the second member 32. From the viewpoint of strength as the probe holder, the first member 31 and the second member 32 are each preferably made of a metal material (including an alloy).

Each of the holder holes 33 and 34 has a stepped hole shape having different diameters along a penetration direction. In other words, the holder hole 33 is constituted by a small diameter portion 33a having an opening on an upper surface side of the first member 31 and a large diameter portion 33b having a diameter larger than that of the small diameter portion 33a. The small diameter portion 33a has a diameter smaller than that of the outer circumference of the above-described pipe members (the pipe members 64, 74, and 84) and larger than that of the distal ends (the distal ends 61a, 71a, and 81a) of the first plungers. The large diameter portion 33b has a diameter equal to that of the outer circumference of the pipe members (the pipe members 64, 74, and 84), or a diameter smaller than the outside diameter of the pipe members within a press-fittable range, or a diameter larger than the outside diameter 1002 of the pipe members within an allowable range of a positional deviation of each of the probes 4 in the probe holder 3.

The holder hole 34 is constituted by a small diameter portion 34a having an opening on a lower end surface of the probe holder 3 and a large diameter portion 34b having a diameter larger than that of the small diameter portion 34a. The small diameter portion 34a has a diameter smaller than that of the outer circumference of the above-described pipe members (the pipe members 64, 74, and 84) and larger than that of the distal ends (the distal ends 62a, 72a, and 82a) of the second plungers. The large diameter portion 34b is preferably equivalent to the large diameter portion 33b, and has a diameter equal to that of the outer circumference of the pipe members (the pipe members 64, 74, and 84), or a diameter smaller than the outside diameter of the pipe members within a press-fittable range, or a diameter larger than the outside diameter 1002 of the pipe members within an allowable range of a positional deviation of each of the probes 4 in the probe holder 3.

Figure 3:
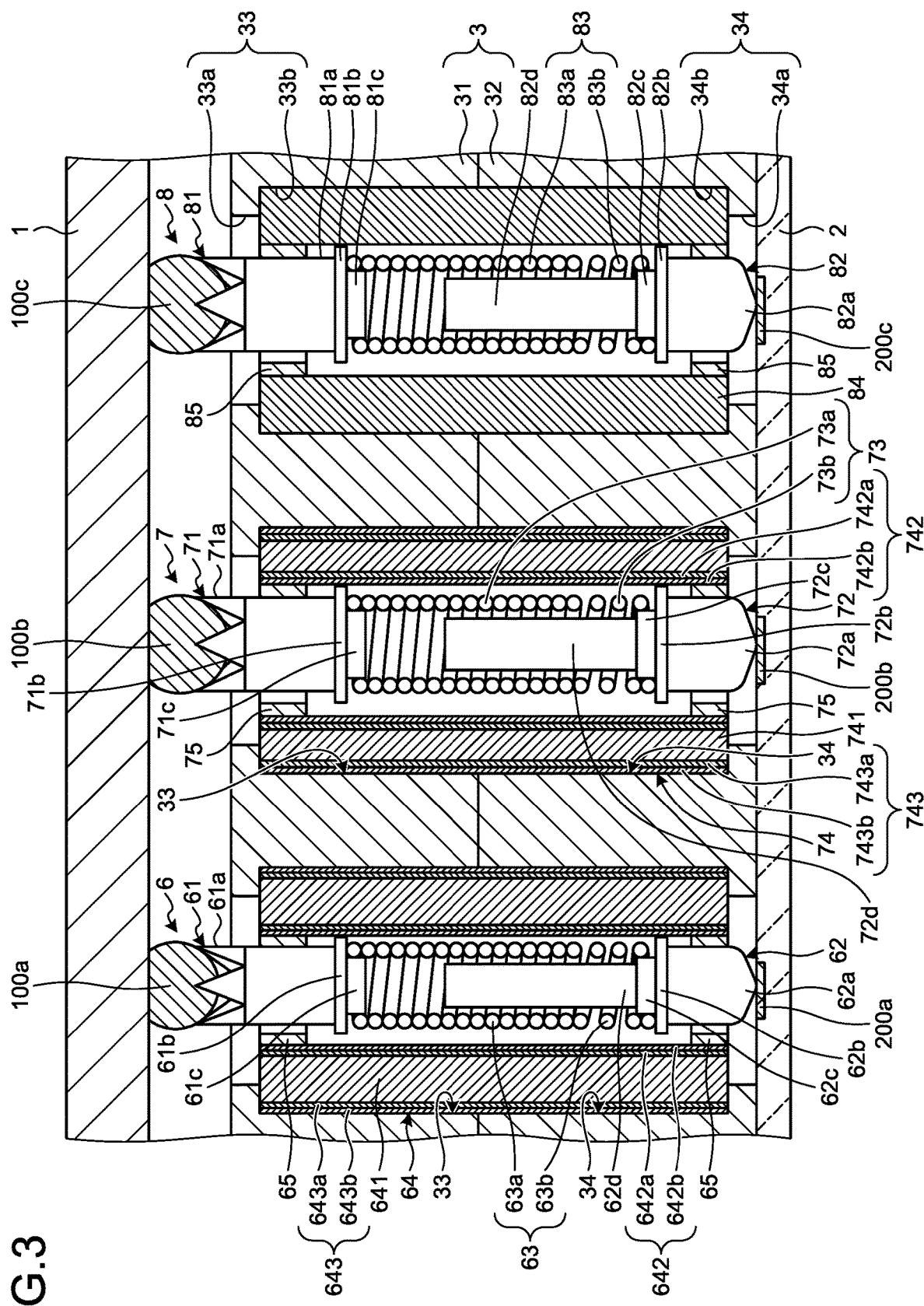
FIG. 3 is a partial sectional view illustrating a configuration of the probe unit during an inspection of a semiconductor integrated circuit (IC) according to the first embodiment of the present invention.

The following describes electrical operations of the probe unit according to the present embodiment during the inspection of the semiconductor IC. FIG. 3 is a partial sectional view illustrating a configuration of the probe unit during the inspection of the semiconductor integrated IC according to the first embodiment of the present invention.

First, an electrical operation of the grounding probe 8 will be described. In the present embodiment, the grounding probe 8 is configured to not only supply a potential from the circuit substrate 2 through electrodes 100c and 200c to the semiconductor IC 1, but also receive a potential from the probe holder 3 and supply the ground potential to the semiconductor IC 1. In other words, as illustrated also in FIG. 2, inner surfaces of the holder holes 33 and 34 accommodating the grounding probe 8 have a configuration of directly contacting the outer circumferential surface of the grounding probe 8, specifically, the third pipe member 84. Since the probe holder 3 is made of the conductive material as described above, the grounding probe 8 is electrically connected to the probe holder 3. Accordingly, an internal charge can freely traverse between the grounding probe 8 and the probe holder 3, so that the potential supplied by the grounding probe 8 has the same value as the potential of the probe holder 3.

Subsequently, an electrical operation of the signal probe 6 will be described. Each of the signal probes 6 receives an electrical signal generated in the circuit substrate 2 from an electrode 200a, and receives and outputs the received electrical signal through an electrode 100a to the semiconductor IC 1. In the signal probe 6, the electrical signal is received from the second plunger 62, flows through the inner circumferential plating 642 via the collar 65 on the second plunger 62 side, and then flows into the first plunger 61 via the collar 65 on the first plunger 61 side. When the proximal end 62d is made in contact with the solid coil portion 63a, the electrical signal may flow from the proximal end 62d to the solid coil portion 63a, and then flow from the solid coil portion 63a into the first plunger 61.

Subsequently, an electrical operation of the power supply probe 7 will be described. The power supply probe 7 receives supply power generated in the circuit substrate 2 from an electrode 200b of the circuit substrate 2, and receives and outputs the received power through an electrode 100b of the semiconductor IC 1 to the semiconductor IC 1. In the power supply probe 7, the power is received from the second plunger 72, flows through the inner circumferential plating 742 via the collar 75 on the second plunger 72 side, and then flows into the first plunger 71 via the collar 75 on the first plunger 71 side. When the proximal end 72d is made in contact with the solid coil portion 73a, the power may flow from the proximal end 72d to the solid coil portion 73a, and then flow from the solid coil portion 73a into the first plunger 71.

The following describes an advantage obtained by using the impedance correction member 641 to correct the characteristic impedance of the signal probe 6. It is known that, generally in an electronic circuit dealing with an alternating current signal, an amount of the signal corresponding to a ratio between different impedance values are reflected at a location where wires having the different impedance values are connected to each other, and the signal is restrained from propagating. This phenomenon also applies to a relation between the semiconductor IC 1 used and the signal probe 6, and when the characteristic impedance of the semiconductor IC 1 has a value greatly different from that of the characteristic impedance of the signal probe 6, a loss of the electrical signal occurs, and the electrical signal is distorted.

The percentage of the signal reflection generated at the connection location by the difference in characteristic impedance is known to increase as the electrical length (length of a propagation path with respect to a period of the electrical signal) of the signal probe 6 increases. In other words, in the case of the probe unit according to the present embodiment, the percentage of the signal reflection of the electrical signal increases with increase in speed, that is, frequency of the semiconductor IC 1. Accordingly, in the case of producing the probe unit corresponding to the semiconductor IC 1 driven at a high frequency, it is important to accurately perform what is called impedance matching to match the value of the characteristic impedance of the signal probe 6 with that of the semiconductor IC 1.

In the first embodiment described above, the hole portions formed of the holder holes 33 and 34 are formed in the probe holder 3, and the signal probes 6, the power supply probes 7, and the grounding probes 8 can be arranged in the hole portions. This configuration allows a change in arrangement of the signal probes 6, the power supply probes 7, and the grounding probes 8 with respect to the respective hole portions. In this case, the arrangement can be changed, for example, by removing the first member 31 from the second member 32, accommodating predetermined types of the probes in predetermined holes of the holder holes 34, and mounting again the first member 31 on the second member 32. According to the first embodiment, the hole portions having the same shape only need to be formed in positions where the probes can be arranged in the probe holder 3. Thus, the simple holder configuration allows the change in arrangement of the contact probes.

The impedance correction members are conventionally bonded to be fixed to the holder holes using, for example, an adhesive. In the first embodiment, however, the bonding process is not required, and work processes can be reduced when the probe unit is assembled. Since the configuration of the holder holes includes no impedance member, the holder holes can be restrained from being crushed or broken.

In the signal probe 6 according to the first embodiment, the inner circumferential plating 642 is formed on the inner circumference of the first pipe member 64. Therefore, the collars 65 can be press-fitted to be fixed to the inner circumference of the first pipe member 64, or fixed to the inner circumference of the first pipe member 64 with the adhesive, and in addition, can be fixed to the inner circumference of the first pipe member 64 by the soldering. In the same way, in the power supply probe the inner circumferential plating 742 is formed on the inner circumference of the second pipe member 74. Therefore, the collars 75 can be press-fitted to be fixed to the inner circumference of the second pipe member 74, or fixed to the inner circumference of the second pipe member 74 with the adhesive, and in addition, can be fixed to the inner circumference of the second pipe member 74 by the soldering.

In the signal probe 6 according to the first embodiment, the outer circumferential plating 643 is formed on the outer circumference of the first pipe member 64. Therefore, the entire outer circumference of the first pipe member 64 can be set to the ground potential through the conductive probe holder 3. This configuration allows some of the hole portions of the probe holder 3 to communicate with one another, and can ensure an adjustable range in thickness of the impedance correction member 641.

In the power supply probe 7 according to the first embodiment, the inner circumferential plating 742 is formed on the inner circumference of the second pipe member 74. Therefore, two paths of a path through the second pipe member 74 and a path through the coil spring 73 can be used as conducting paths for the power. This configuration can increase the allowable current of the power supply probe 7.

In each of the probes according to the first embodiment, the first plunger, the second plunger, and the coil spring in the pipe member can be easily taken out by removing one of the collars. This configuration allows an easy replacement of the first plunger, the second plunger, and the coil spring when the probe is repaired.

In the first embodiment, each pair of the holder holes 33 and 34 for holding any one of the probes have been described as being independently provided. However, some of the adjacent holder holes may communicate with each other. For example, communications may be established between the large diameter portions 33b of the adjacent holder holes 33 and between the large diameter portions 34b of the adjacent holder holes 34, or a communication may be established between the large diameter portions 33b of the holder holes 33, with the holder holes 34 being independent from one another.

Second Embodiment

Figure 4:
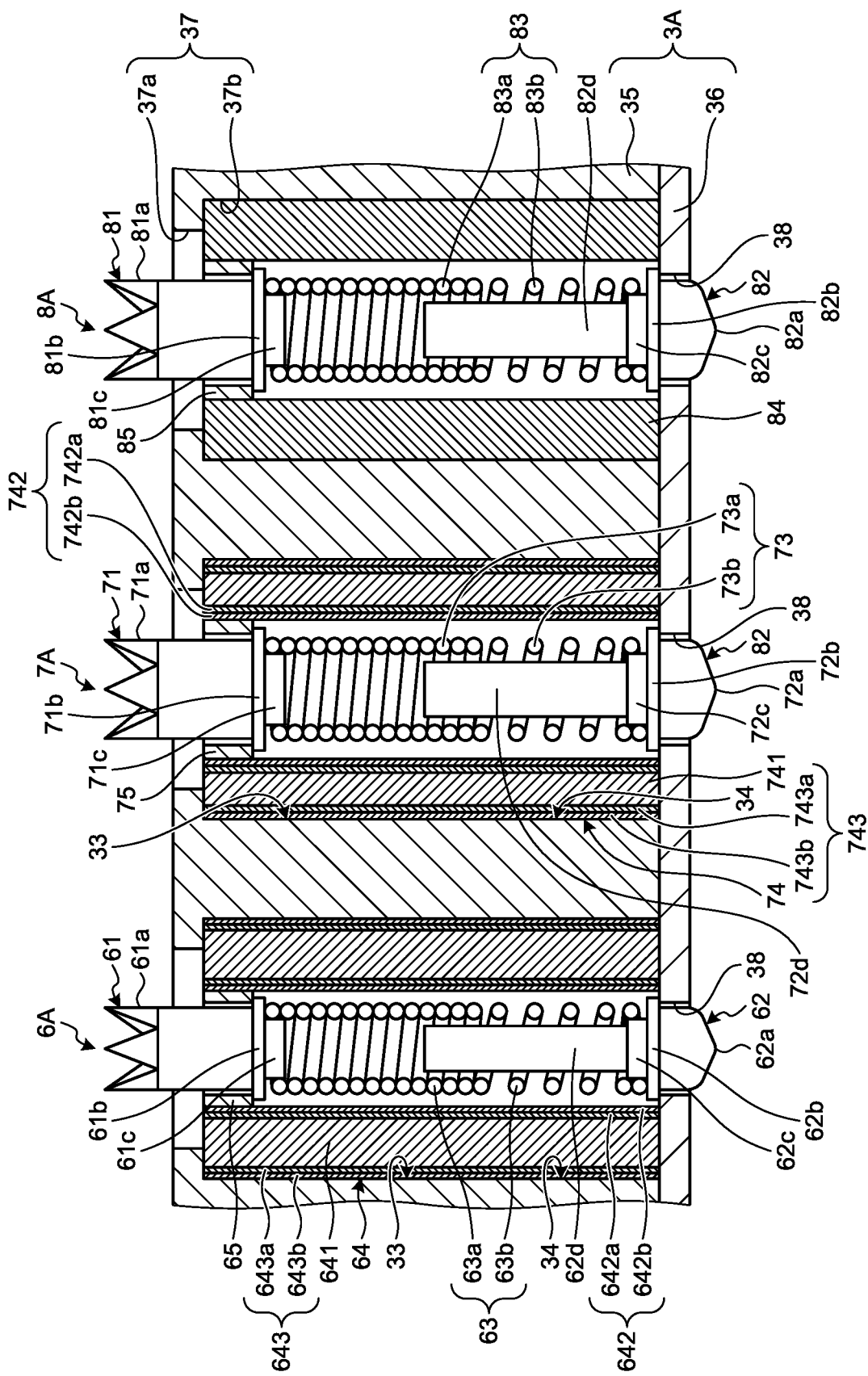
FIG. 4 is a partial sectional view illustrating a detailed structure of a probe holder and probes constituting a probe unit according to a second embodiment of the present invention.

FIG. 4 is a partial sectional view illustrating a detailed structure of a probe holder and probes constituting a probe unit according to a second embodiment of the present invention. In the above-described first embodiment, the configuration has been described in which both ends of the pipe members are provided with the collars. The present invention is, however, not limited to this configuration. In the second embodiment, only the first plunger sides are provided with the collars.

The probe unit according to the second embodiment includes the circuit substrate 2 (FIG. 1) including the circuit for, for example, generating the signals to be supplied to the semiconductor IC 1 (FIG. 1), a probe holder 3A disposed on the circuit substrate 2 and including predetermined hole portions, and probes (signal probes 6A, power supply probes 7A, and grounding probes 8A) accommodated in the hole portions of the probe holder 3A.

Each of the signal probes 6A is the same as the signal probe 6 except that the collar 65 on the second plunger 62 side is excluded from the configuration of the signal probe 6 described above. In the same way, each of the power supply probes 7A is the same as the power supply probe 7 described above except that the collar 75 on the is excluded, and each of the grounding probes 8A is the same as the grounding probe 8 described above except that the collar 85 on the side of the second plunger 82 of the grounding probe 8 is excluded.

The probe holder 3A includes a holder substrate 35 made of a conductive material, such as a metal, and an insulating substrate 36 provided on one surface of the holder substrate 35. The probe holder 3A has a structure in which hole portions (holder holes) are formed in areas thereof corresponding to arrangement locations of the probes and the hole portions accommodate the probes.

The probe holder 3A is laminated with the holder substrate 35 and the insulating substrate 36. The holder substrate 35 is made of, for example, a conductive material, such as a metal. The insulating substrate 36 is made of, for example, an insulating material, such as polyether ether ketone (PEEK), polyimide (PI), or polyethersulfone (PEE). In addition to the metal, any conductive materials are applicable for the holder substrate 35. From the viewpoint of strength as the probe holder, the holder substrate 35 is preferably made of a metal material (including an alloy).

The holder substrate 35 and the insulating substrate 36 are provided with the same numbers of holder holes 37 and 38, respectively, serving as the hole portions for accommodating the probes. The holder holes 37 and 38 for accommodating the probes are formed such that the axis lines of each of the holder holes 37 and corresponding one of the holder holes 38 coincide with each other. The holder holes 37 and 38 are formed in positions covering all possible wiring patterns in the semiconductor IC 1 to be inspected.

Each of the holder holes 37 has a stepped hole shape having different diameters along a penetration direction. In other words, the holder hole 37 is constituted by a small diameter portion 37a having an opening on an upper surface side of the holder substrate 35 and a large diameter portion 37b having an opening on a lower side of the holder substrate 35 on which the insulating substrate 36 is disposed and having a diameter larger than that of the small diameter portion 37a. The small diameter portion 37a has a diameter smaller than that of the outer circumference of the above-described pipe members (the pipe members 64, 74, and 84) and larger than that of the distal ends (the distal ends 61a, 71a, and 81a) of the first plungers. The large diameter portion 37b has a diameter equal to that of the outer circumference of the pipe members (the pipe members 64, 74, and 84), or a diameter smaller than the outside diameter of the pipe members within a press-fittable range, or a diameter larger than the outside diameter 1002 of the pipe members within an allowable range of a positional deviation of each of the probes in the probe holder 3A.

Each of the holder holes 38 has a hole shape having an opening on a lower end surface of the probe holder 3A. The holder hole 38 has a diameter smaller than that of the outer circumference of the above-described pipe members (the pipe members 64, 74, and 84) and larger than that of the distal ends (the distal ends 62a, 72a, and 82a) of the second plungers.

In the second embodiment, the large diameter portion 37b and the holder hole 38 form a stepped portion. For example, the flange 62b of the second plunger 62 abuts on the stepped portion to be prevented from coming off of the probe holder 3A.

In the probe unit configured as described above, the plungers and the coil springs operate in the same way as in the first embodiment described above during the inspection of the semiconductor IC. In the second embodiment, for example, the proximal end of the second plunger contacts the solid coil portion of the coil spring. In the second embodiment, the electrical signal flowing through the probe unit flows from the second plunger into the first plunger via the solid coil portion. For example, in the signal probe 6A, the electrical signal having flowed into the second plunger 62 flows from the proximal end 62d to the solid coil portion 63a, and then flows from the solid coil portion 63a into the first plunger 61. The flange 62b may contact the inner circumferential plating 642 of the first pipe member 64 so as to let the electrical 15: signal flow from the second plunger 62 to the inner circumferential plating 642 of the first pipe member 64.

The signal probe 6A, the power supply probe 7A, and the grounding probe 8A all include no collar on the second plunger side. Therefore, the probe as a separate component may allow the first plunger, the second plunger, and the coil spring to come off of the pipe member. When each of the probes is handled separately, a cap is preferably used to prevent the plungers and the coil spring from coming off of the pipe member.

Figure 5:
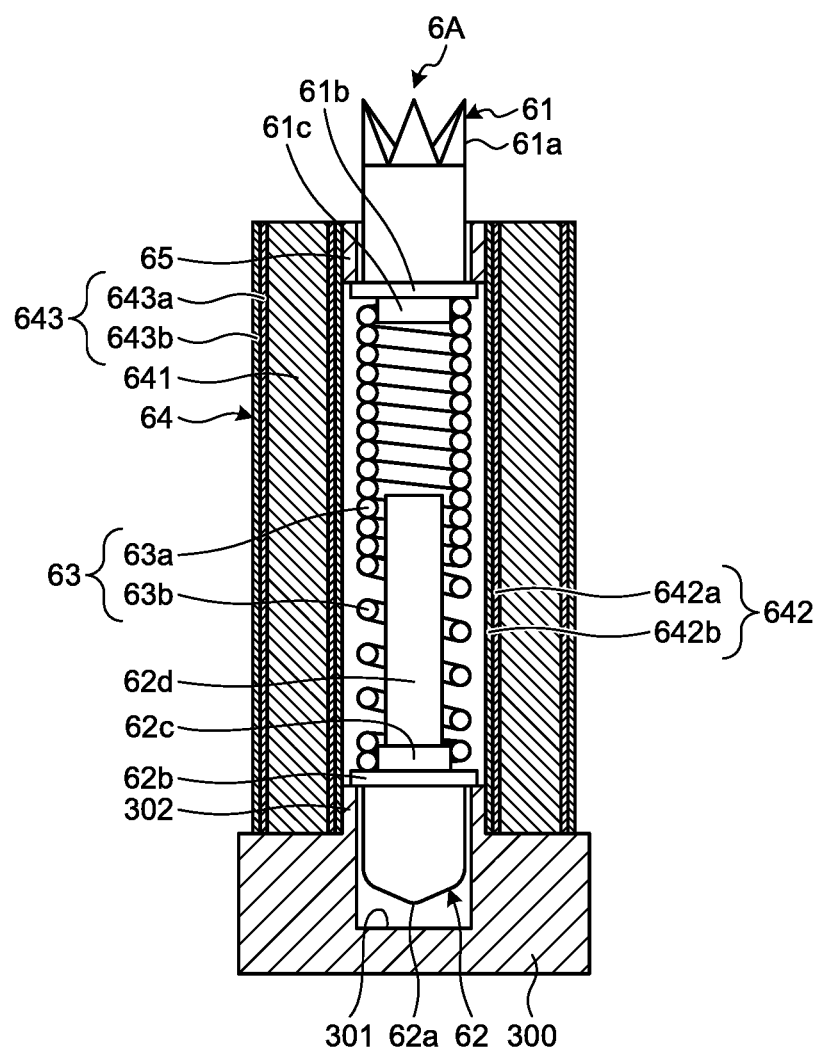
FIG. 5 is a partial sectional view illustrating a configuration when a cap is mounted on one of the probes constituting the probe unit according to the second embodiment of the present invention.

FIG. 5 is a partial sectional view illustrating a configuration when the cap is mounted on one of the probes constituting the probe unit according to the second embodiment of the present invention. While FIG. 5 demonstrates an example in which a cap 300 is mounted on the signal probe 6A, the same cap is also mounted on the power supply probe 7A and the grounding probe 8A.

The cap 300 is provided with an accommodating portion 301 having a hole shape for accommodating a part of the distal end 62a of the second plunger 62 and a projecting portion 302 cylindrically projecting along an inner circumferential surface of the accommodating portion 301. The projecting portion 302 has an inside diameter equal to the diameter of the accommodating portion 301 and an outside diameter having a size equal to or press-fittable to the inside diameter 1003 of the first pipe member 64.

The cap 300 is mounted over an opening on the second plunger 62 side of the first pipe member 64 to prevent the second plunger 62 from coming off of the first pipe member 64. In this case, the projecting portion 302 enters a gap between the distal end 62a and the first pipe member 64, and abuts on the flange 62b to prevent the distal end of the distal end 62a from interfering with the bottom of the accommodating portion 301. The projecting portion 302 is press-fitted into the first pipe member 64, and thereby, the cap 300 is held by the first pipe member 64.

In the second embodiment described above, the hole portions formed of the holder holes 37 and 38 are formed in the probe holder 3A, and the signal probes 6A, the power supply probes 7A, and the grounding probes 8A can be arranged in the hole portions. This configuration allows a change in arrangement of the signal probes 6A, the power supply probes 7A, and the grounding probes 8A with respect to the respective hole portions. According to the second embodiment, since the hole portions having the same shape only need to be formed in positions where the probes can be arranged in the probe holder 3A. Thus, the simple holder configuration allows the change in arrangement of the contact probes.

In the second embodiment, the large diameter portion 37*b* and the holder hole 38 form the stepped portion in the probe holder 3A, and the stepped portion has the function to prevent the second plunger from coming off. Such a configuration eliminates the need for the collar on the second plunger side in each of the signal probe 6A, the power supply probe 7A, and the grounding probe 8A, so that the number of components can be reduced.

In the second embodiment, since the cap is mounted on each of the probes to prevent the first plunger, the second plunger, and the coil spring from coming off of the pipe member, the probe can be easily handled separately.

First Modification of Second Embodiment

Figure 6:
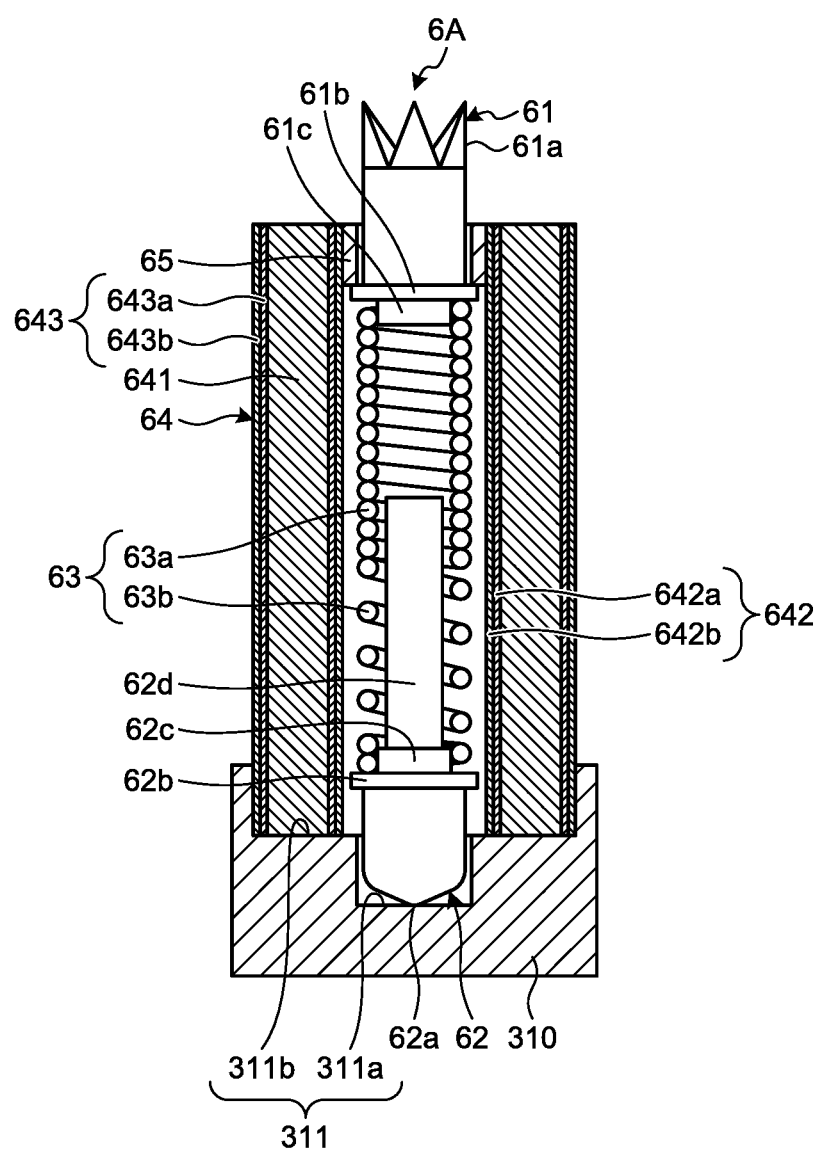
FIG. 6 is a partial sectional view illustrating a configuration of a cap according to a first modification of the second embodiment of the present invention.

FIG. 6 is a partial sectional view illustrating a configuration of a cap according to a first modification of the second embodiment of the present invention. In the second embodiment described above, the projecting portion 302 of the cap 300 has been described as being press-fitted into the first pipe member 64 to be held by the first pipe member 64. However, in the first modification, a cap 310 holds the first pipe member 64. While FIG. 6 demonstrates an example in which the cap 310 is mounted on the signal probe 6A, the same cap is also mounted on the power supply probe 7A and the grounding probe 8A.

An accommodating portion 311 is formed in the cap 310, and includes a first accommodating portion 311*a* having a hole shape for accommodating a part of the distal end 62*a* of the second plunger 62 and a second accommodating portion 311*b* having a hole shape for accommodating a part of the first pipe member 64. The second accommodating portion 311*b* has an inside diameter having a size equal to or press-fittable to the outside diameter 1003 of the first pipe member 64.

The cap 310 is mounted over the opening on the second plunger 62 side of the first pipe member 64 to prevent the second plunger 62 from coming off of the first pipe member 64. In this case, for example, the first pipe member 64 is press-fitted into the cap 310, and the cap 310 holds the first pipe member 64.

Second Modification of Second Embodiment

Figure 7:
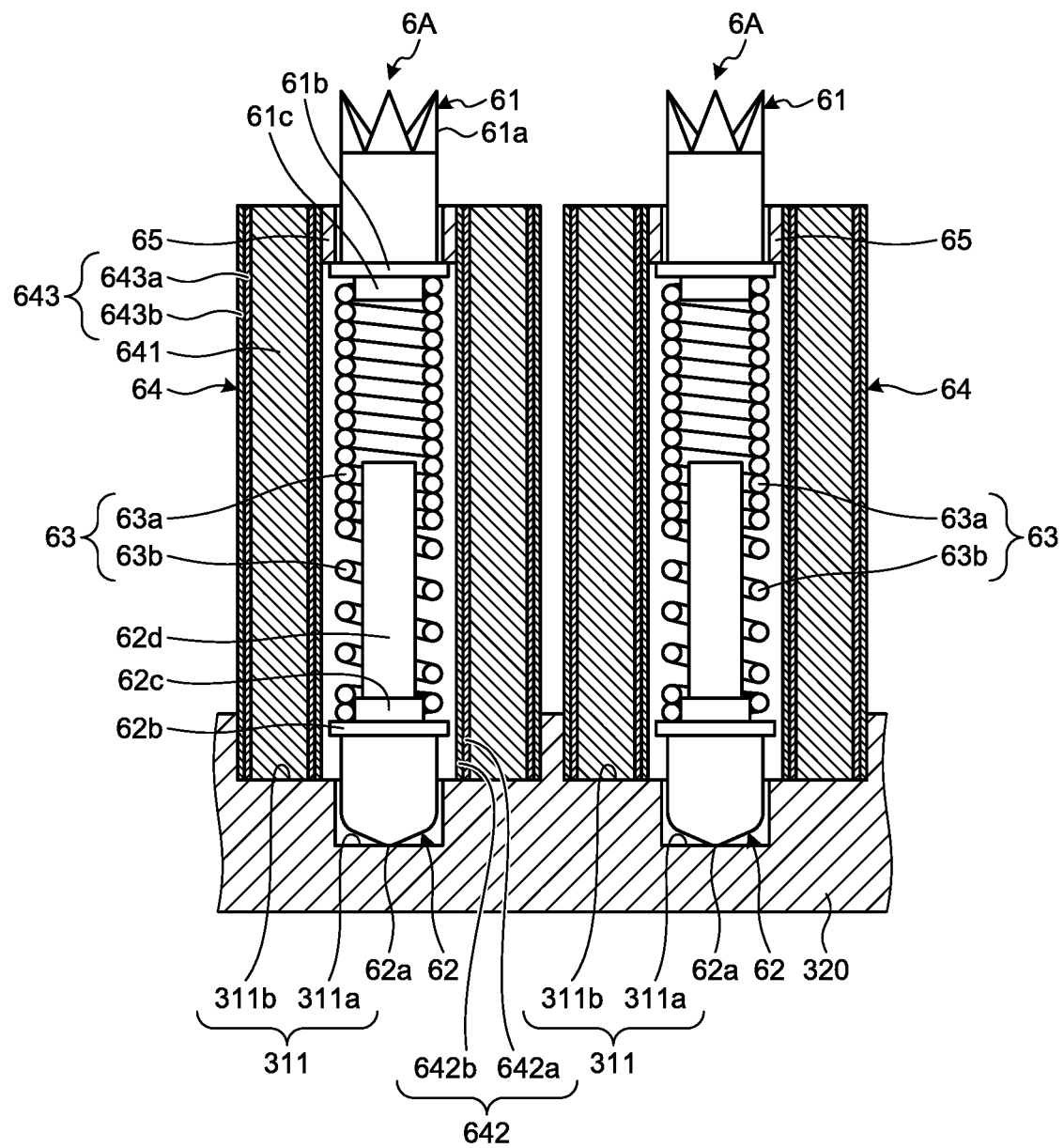
FIG. 7 is a partial sectional view illustrating a configuration of a cap according to a second modification of the second embodiment of the present invention.

FIG. 7 is a partial sectional view illustrating a configuration of a cap according to a second modification of the second embodiment of the present invention. In the second embodiment and the first modification described above, the caps 300 and 310 each hold one probe. However, in the second modification, a cap 320 holds a plurality of probes.

Two of the accommodating portions 311 are formed in the cap 320, and each include the first accommodating portion 311*a* having a hole shape for accommodating a part of the distal end 62*a* of the second plunger 62 and the second accommodating portion 311*b* having a hole shape for accommodating a part of the first pipe member 64.

The cap 320 holds the first pipe member 64 in each of the accommodating portions 311 to prevent the second plunger 62 from coming off of the first pipe member 64.

Third Modification of Second Embodiment

Figure 8:
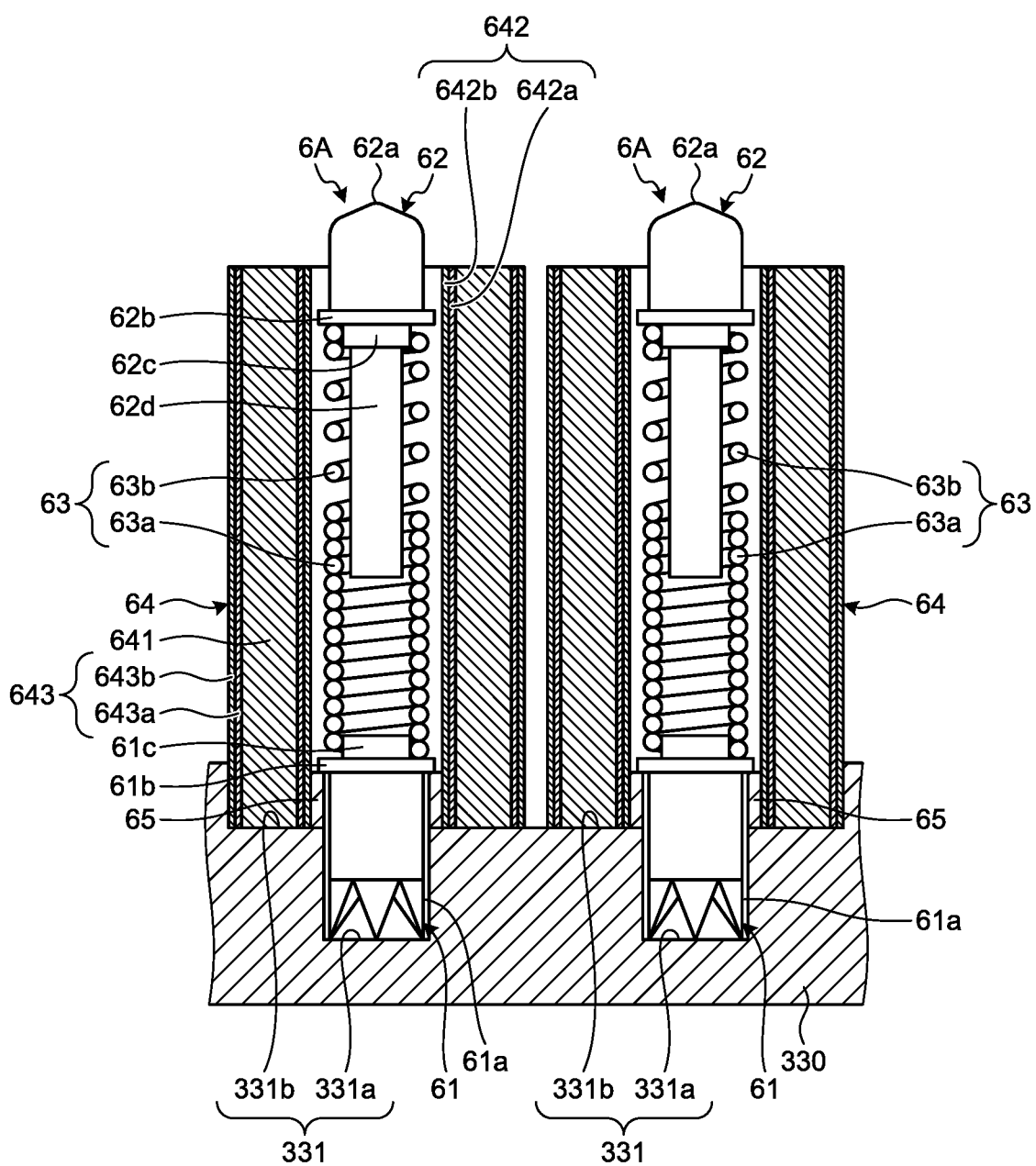
FIG. 8 is a partial sectional view illustrating a configuration of a cap according to a third modification of the second embodiment of the present invention.

FIG. 8 is a partial sectional view illustrating a configuration of a cap according to a third modification of the second embodiment of the present invention. In the second modification of the second embodiment described above, the cap 320 has been described as holding the ends on the second plunger 62 sides of the first pipe members 64. However, an the third modification, a cap 330 holds the ends on the first plunger 61 sides of the first pipe members 64.

Two accommodating portions 331 are formed in the cap 330, and each include a first accommodating portion 331*a* having a hole shape for accommodating a part of the distal end 61*a* of the first plunger 61 and a second accommodating portion 331*b* having a hole shape for accommodating a part of the first pipe member 64.

In the cap 330, each of the accommodating portions 331 holds the end on the first plunger 61 side of the first pipe member 64 so as to make the second plunger 62 face upward, and prevents the second plunger 62 from coming off of the first pipe member 64.

In the second and third modifications, the examples have been described in which the caps 320 and 330 each hold the two signal probes 6A. However, the caps can each fold three or more probes.

In the above-described second and third modifications, the examples have been described in which the signal probes 6A are mounted on the caps 320 and 330. The same caps are each mounted on the power supply probes 7A and the grounding probes 8A. The caps 320 and 330 may each hold a plurality of types of the probes. For example, the caps 320 and 330 may each hold the signal probe 6A and the power supply probe 7A.

Third Embodiment

Figure 9:
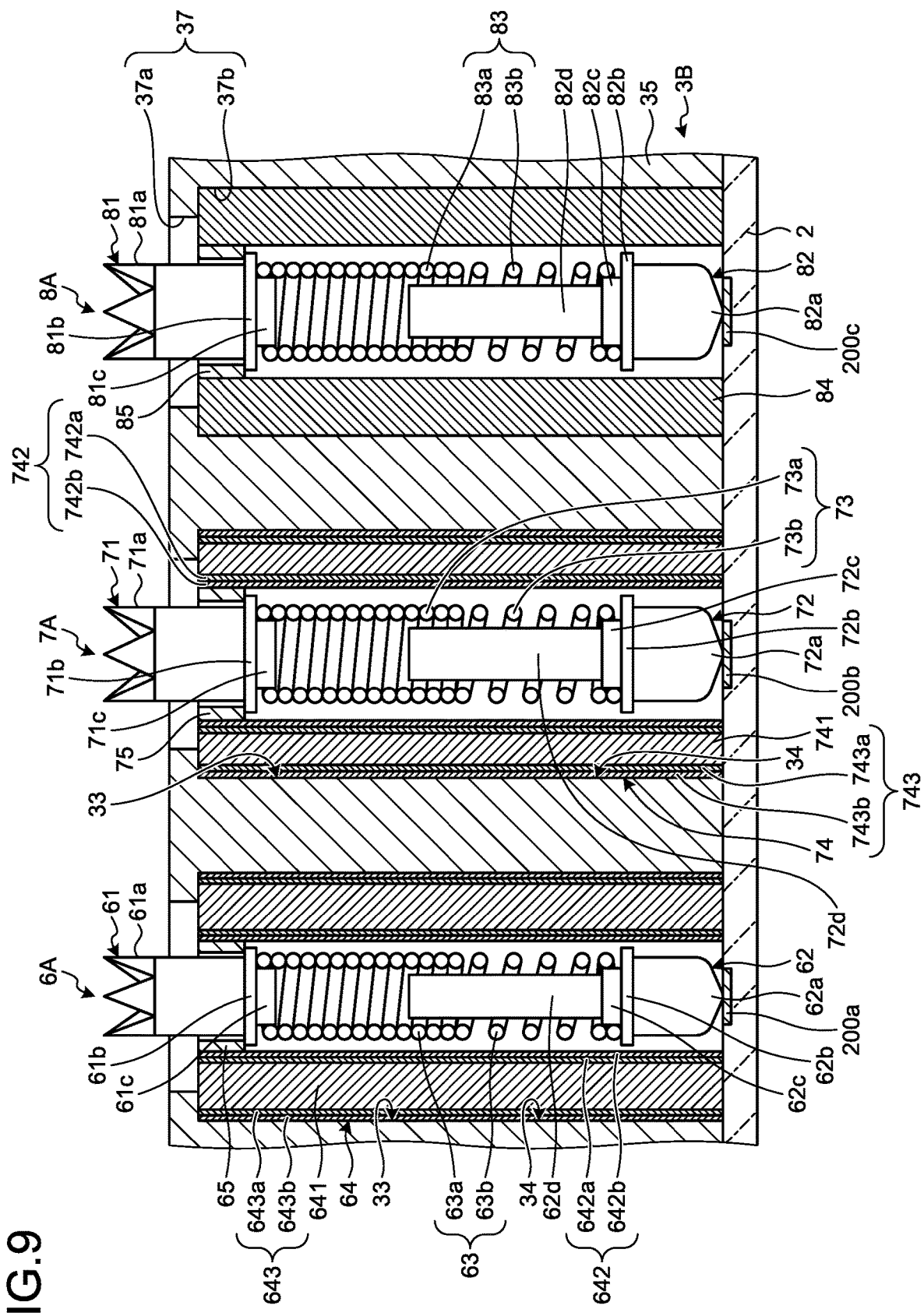
FIG. 9 is a partial sectional view illustrating a detailed structure of a probe holder and the probes constituting a probe unit according to a third embodiment of the present invention.

FIG. 9 is a partial sectional view illustrating a detailed structure of a probe holder and the probes constituting a probe unit according to a third embodiment of the present invention. The third embodiment has a configuration in which the collars are provided only on the first plunger 61 sides, and the circuit substrate 2 is stacked in advance.

The probe unit according to the third embodiment includes the circuit substrate 2 (FIG. 1) including the circuit for, for example, generating the signals to be supplied to the semiconductor IC 1 (FIG. 1), a probe holder 3B disposed on the circuit substrate 2 and including predetermined hole portions, and the probes (the signal probes 6A, the power supply probes 7A, and the grounding probes 8A) accommodated in the hole portions of the probe holder 3B. The following describes only the probe holder 3B having a different configuration from that in the second embodiment described above, and the same configuration will not be described.

The probe holder 33 includes the holder substrate 35 made of a conductive material, such as a metal. In other words, the probe holder 38 has a configuration obtained by excluding the insulating substrate 36 from the probe holder 3A described above. The length in the axis line direction of the holder hole 37 can be changed as appropriate according to the length in the axis line direction of the plunger or the coil spring.

The circuit substrate 2 is mounted in advance on the holder substrate 35 in the probe holder 33. In the third embodiment, the second plungers (the second plungers 62, 72, and 82) contact the electrodes (the electrodes 200a, 200b, and 200c) of the circuit substrate 2 to be prevented from coming off of the probe holder 33.

In the probe unit configured as described above, the plungers and the coil springs operate in the same way as in the second embodiment described above during the inspection of the semiconductor IC. Also in the third embodiment, the electrical signal flowing through the probe unit flows from the second plunger into the first plunger via the solid coil portion. For example, in the signal probe 6A, the electrical signal having flowed into the second plunger 62 flows from the proximal end 62d to the solid coil portion 63a, and then flows from the solid coil portion 63a into the first plunger 61.

In the third embodiment described above, the holder holes 37 are formed in the probe holder 3B, and the signal probes 6A, the power supply probes 7A, and the grounding probes BA can be arranged in the holder holes 37. This configuration allows a change in arrangement of the signal probes 6A, the power supply probes 7A, and the grounding probes 8A with respect to the respective holder holes 37. According to the third embodiment, since the hole portions having the same shape only need to be formed in positions where the probes can be arranged in the probe holder 3B. Thus, the simple holder configuration allows the change in arrangement of the contact probes.

In the third embodiment, the second plunger is prevented from coming off by mounting the circuit substrate 2 on the probe holder 35. Such a configuration eliminates the need for the collar on the second plunger side in each of the signal probe 6A, the power supply probe 7A, and the grounding probe 8A, so that the number of components can be reduced.

Fourth Embodiment

Figure 10:
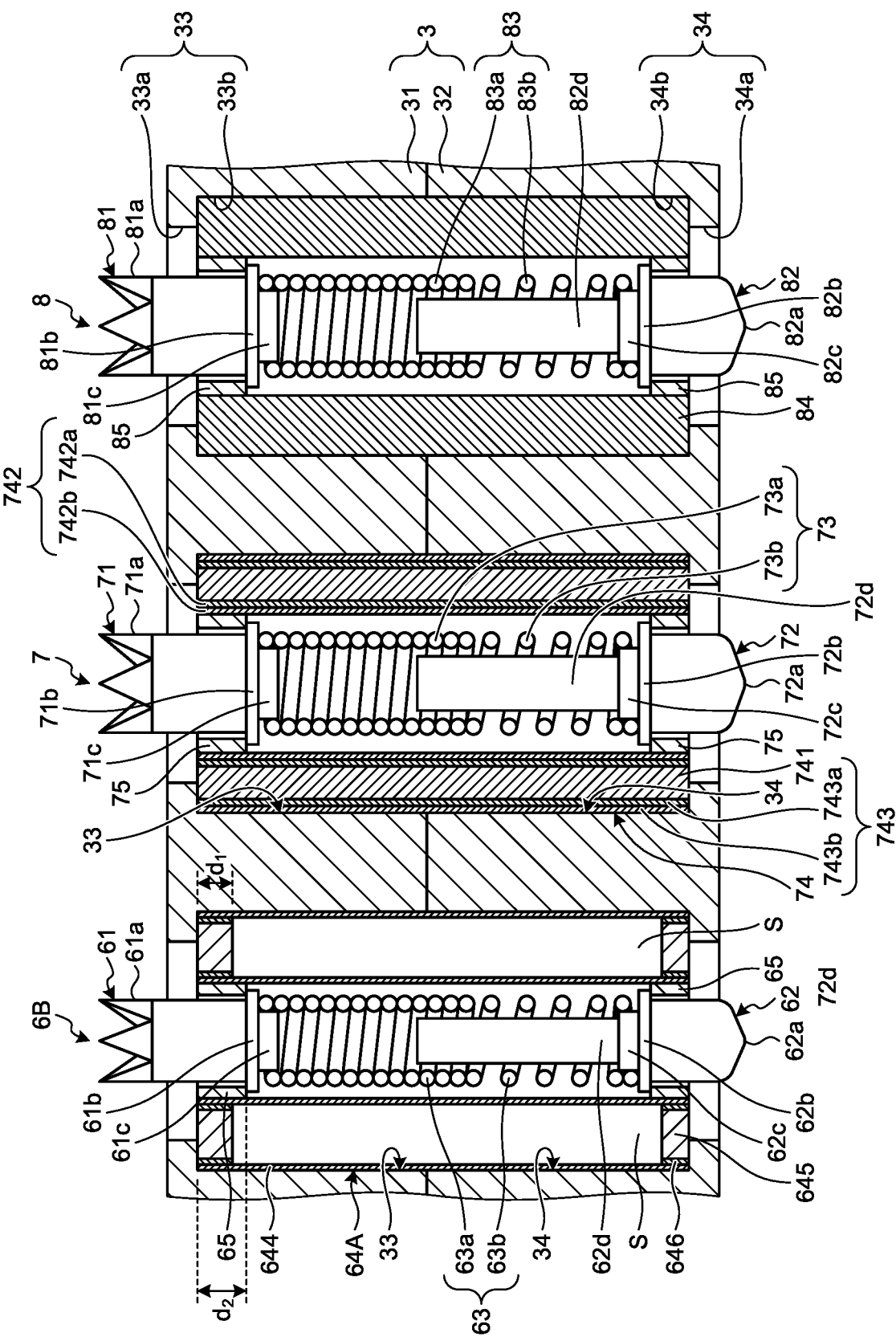
FIG. 10 is a partial sectional view illustrating a detailed structure of the probe holder and probes constituting a probe unit according to a fourth embodiment of the present invention.

FIG. 10 is a partial sectional view illustrating a detailed structure of the probe holder and probes constituting a probe unit according to a fourth embodiment of the present invention. In the fourth embodiment, air in the signal probe corrects the impedance thereof.

The probe unit according to the fourth embodiment includes the circuit substrate 2 (FIG. 1) including the circuit for, for example, generating the signals to be supplied to the semiconductor IC 1 (FIG. 1), the probe holder 3 disposed on the circuit substrate 2 and including the predetermined hole portions, and probes (signal probes 6B, the power supply probes 7, and the grounding probes 8) accommodated in the hole portions of the probe holder 3. The following describes only the signal probes 6B having a different configuration from that in the first embodiment described above, and the same configuration will not be described.

Bach of the signal probes 6B includes the first plunger 61, the second plunger 62, and the coil spring 63 described above, a first pipe member 64A that accommodates portions of the first plunger 61 and the second plunger 62 and accommodates the coil spring 63, and the collars 65 provided at both ends of the first pipe member 64A. The signal probe 6B differs from the signal probe 6 described above only in the first pipe member. The following describes a configuration of the first pipe member 64A.

The first pipe member 64A has a cylindrical shape in which the first plunger 61, the second plunger 62, and the coil spring 63 are insertable. The first pipe member 64A includes a metal pipe 644 constituted by an outer circumferential pipe and an inner circumferential pipe forming a double-pipe structure made of a metal, insulating pipes 645 provided at both ends of the metal pipe 644, and platings 646 provided between the metal pipe 644 and the insulating pipes 645. The metal pipe 644 is formed of, for example, nickel, copper, or an alloy primarily containing nickel or copper. A pipe-shaped member with plated surfaces may be used as the metal pipe 644. The insulating pipes 645 are produced using an insulating material, such as ceramic.

The first plunger 61, the second plunger 62, and the coil spring 63 are inserted in a hollow space formed by the inner circumferential pipe of the first pipe member 64A. The first pipe member 64A includes an air layer S formed by sealing a hollow space (hereinafter, called "outer circumferential-side hollow space") formed between the inner circumferential pipe and the outer circumferential pipe of the metal pipe 644 at both ends of the outer circumferential-side hollow space with the insulating pipes 645 and the platings 646. In the first pipe member 64A, the air layer S corrects the characteristic impedance of the signal probe 63 so as to be equal to, for example, a generally employed value of 50 ohms.

The collars 65 are provided at both ends of the first pipe member 64A, and form stepped portions in conjunction with the inner circumferential surface of the first pipe member 64A. The flange 61b of the first plunger 61 and the flange 62b of the second plunger 62 abut on the stepped portions to be prevented from coming off of the first pipe member 64A.

The characteristic impedance of the signal probe 63 can be adjusted by adjusting a length $d_1$ in the axis line direction of each of the insulating pipes 645 to adjust the volume and forming position of the air layer S. The length $d_1$ is preferably smaller than a length $d_2$ in the axis line direction of the collar 65. A dielectric for impedance adjustment may be provided between the insulating pipes 645 in the first pipe member 64A.

In the probe unit configured as described above, the plungers and the coil springs operate in the same way as in the first embodiment described above during the inspection of the semiconductor IC. In the fourth embodiment, the electrical signal to flow through the signal probe 63 is received from the second plunger 62, flows through the platings 646 or the metal pipe 644 via the collar 65 on the second plunger 62 side, and then flows into the first plunger 61 via the collar 65 on the first plunger 61 side. When the proximal end 62d is made in contact with the solid coil portion 63a, the electrical signal may flow from the proximal end 62d to the solid coil portion 63a, and then flow from the solid coil portion 63a into the first plunger 61.

In the fourth embodiment described above, in the same way as in the first embodiment, the hole portions formed of the holder holes 33 and 34 are formed in the probe holder 3, and the signal probes 65, the power supply probes 7, and the grounding probes 8 can be arranged in the hole portions. This configuration allows a change in arrangement of the signal probes 65, the power supply probes 7, and the grounding probes 8 with respect to the respective hole portions. According to the fourth embodiment, the hole portions having the same shape only need to be formed in positions where the probes can be arranged in the probe holder 3. Thus, the simple holder configuration allows the change in arrangement of the contact probes.

According to the fourth embodiment described above, since the air layer S is formed in the first pipe member 64A, the air layer S can correct the impedance of the signal probe 65.

Fifth Embodiment

Figure 11:
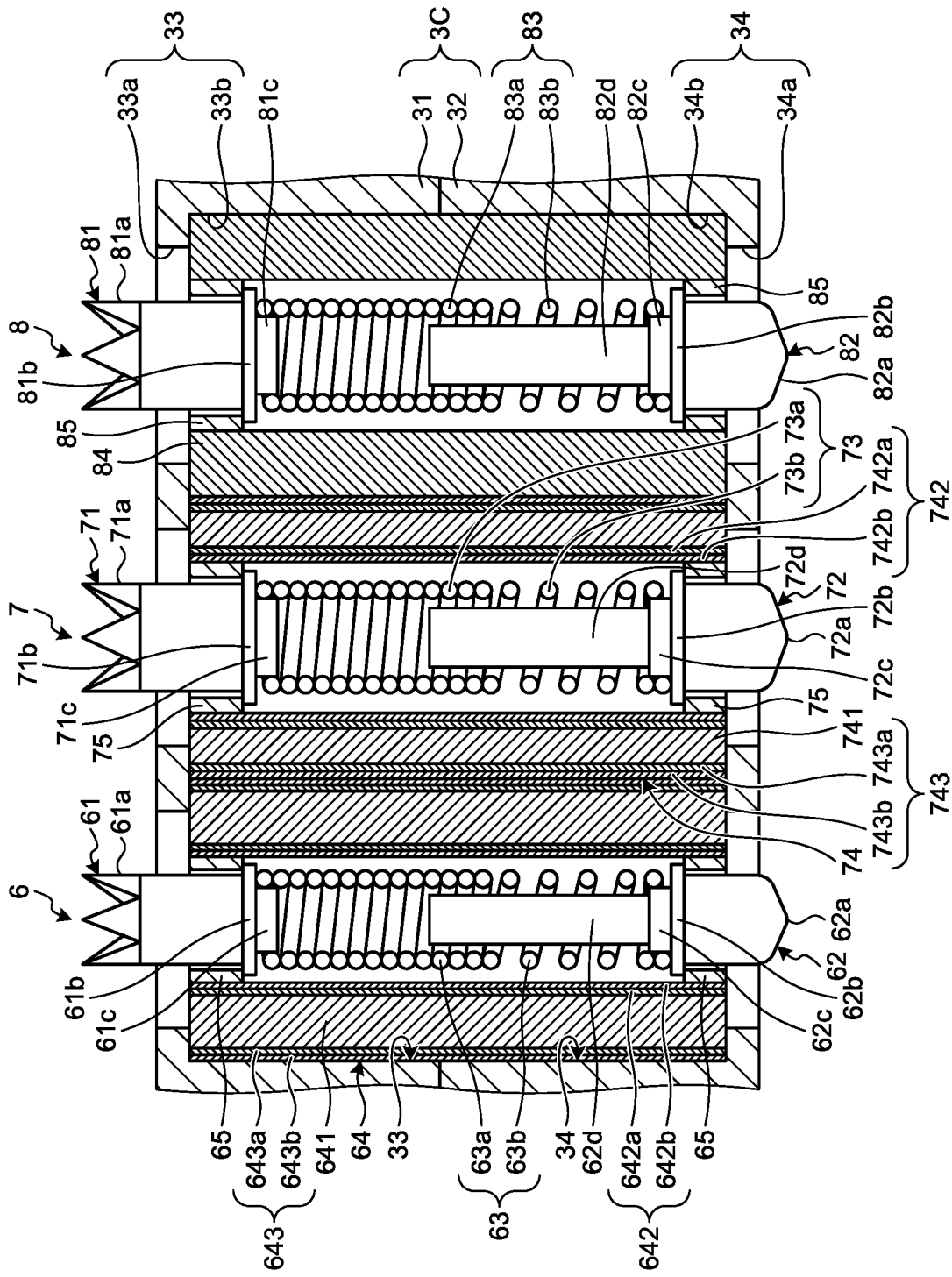
FIG. 11 is a partial sectional view illustrating a detailed structure of a probe holder and the probes constituting a probe unit according to a fifth embodiment of the present invention.

FIG. 11 is a partial sectional view illustrating a detailed structure of the probe holder and the probes constituting a probe unit according to a fifth embodiment of the present invention. In the fifth embodiment, a probe holder 3C holds the adjacent probes so as to contact each other.

The probe unit according to the fifth embodiment includes the circuit substrate 2 (FIG. 1) including the circuit for, for example, generating the signals to be supplied to the semiconductor IC 1 (FIG. 1), the probe holder 3C disposed on the circuit substrate 2 and including the predetermined hole portions, and the probes (the signal probes 6, the power supply probes 7, and the grounding probes 8) accommodated in the hole portions of the probe holder 3C. The following describes only the probe holder 3C having a different configuration from that in the first embodiment described above, and the same configuration will not be described.

As described above, the probe holder 30 is laminated with the first member 31 and the second member 32. The first member 31 and the second member 32 are provided with the same numbers of the holder holes 33 and 34, respectively, serving as the hole portions for accommodating the probes. In the fifth embodiment, adjacent large diameter portions of the large diameter portions (33b and 34b) of the respective holder holes contact each other, and communicate with each other at these contact portions.

Therefore, each of the pipe members accommodated in the holder portions contacts a part of the outer circumferential surface of the pipe member of adjacent one of the probes. At least the outer circumferential surface of the pipe member of each of the probes is conductive. Therefore, in FIG. 11, the power supply probe 7 directly contacts the grounding probe 8, and the signal probe 6 is electrically connected to the grounding probe 8 through the power supply probe 7. As a result, the entire outer surface of the pipe member of each of the probes is set to the ground potential.

In the fifth embodiment described above, the same effects as those of the first embodiment described above can be obtained, and since each of the probes held in the probe holder 3C is electrically connected to the grounding probe 8, the entire outer surface of the pipe member of each of the probes can be more reliably set to the ground potential.

First Modification of Fifth Embodiment

Figure 12:
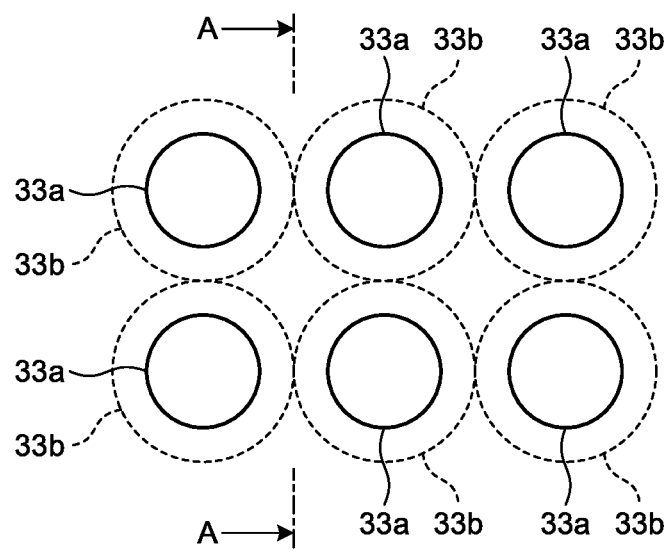
FIG. 12 is a top view illustrating a configuration of a probe holder constituting a probe unit according to a first modification of the fifth embodiment of the present invention.
Figure 13:
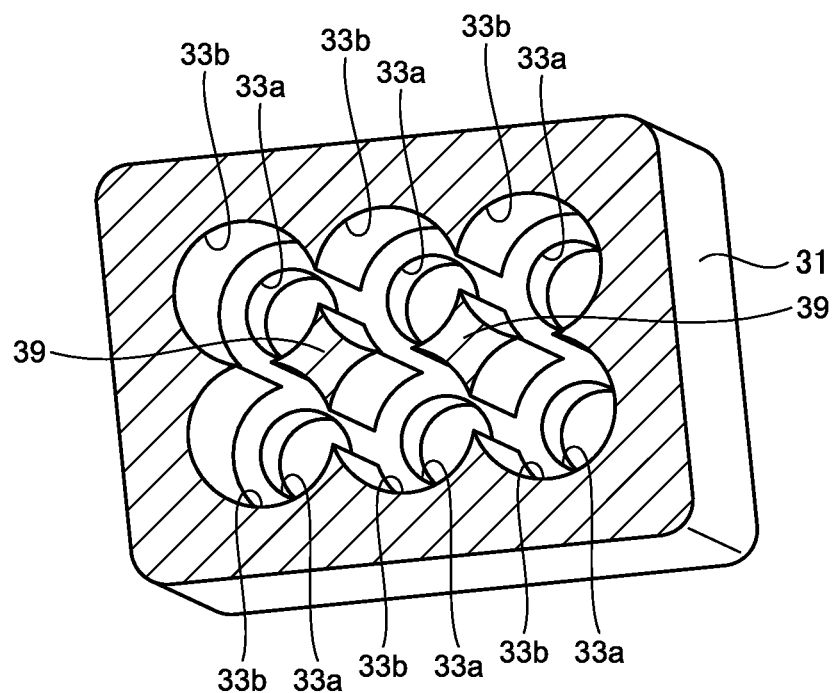
FIG. 13 is a perspective sectional view illustrating the configuration of the probe holder constituting the probe unit according to the first modification of the fifth embodiment of the present invention.

FIG. 12 is a top view illustrating a configuration of a probe holder constituting a probe unit according to a first modification of the fifth embodiment of the present invention. FIG. 13 is a perspective sectional view illustrating the configuration of the probe holder constituting the probe unit according to the first modification of the fifth embodiment of the present invention, and is a perspective sectional view with a cutting plane orthogonal to the axis lines of the holder holes 33 and passing through the large diameter portions 33b. In the same way as the fifth embodiment described above, the first modification has a configuration in which the large diameter portions of the adjacent holder holes contact each other and parts of the large diameter portions communicate with each other, and the holder holes are arranged in a grid pattern.

As illustrated in FIG. 12, when the holder holes 33 are arranged in a grid pattern and the adjacent large diameter portions 33b contact each other, rhombic columnar portions 39 each surrounded by four of the large diameter portions 33b are formed in the first member 31, Each of the rhombic columnar portions 39 contacts the pipe members of the probes to position the probes and restrain the axis lines of the probes from inclining with respect to the axis lines of the holder holes.

Second Modification of Fifth Embodiment

Figure 14:
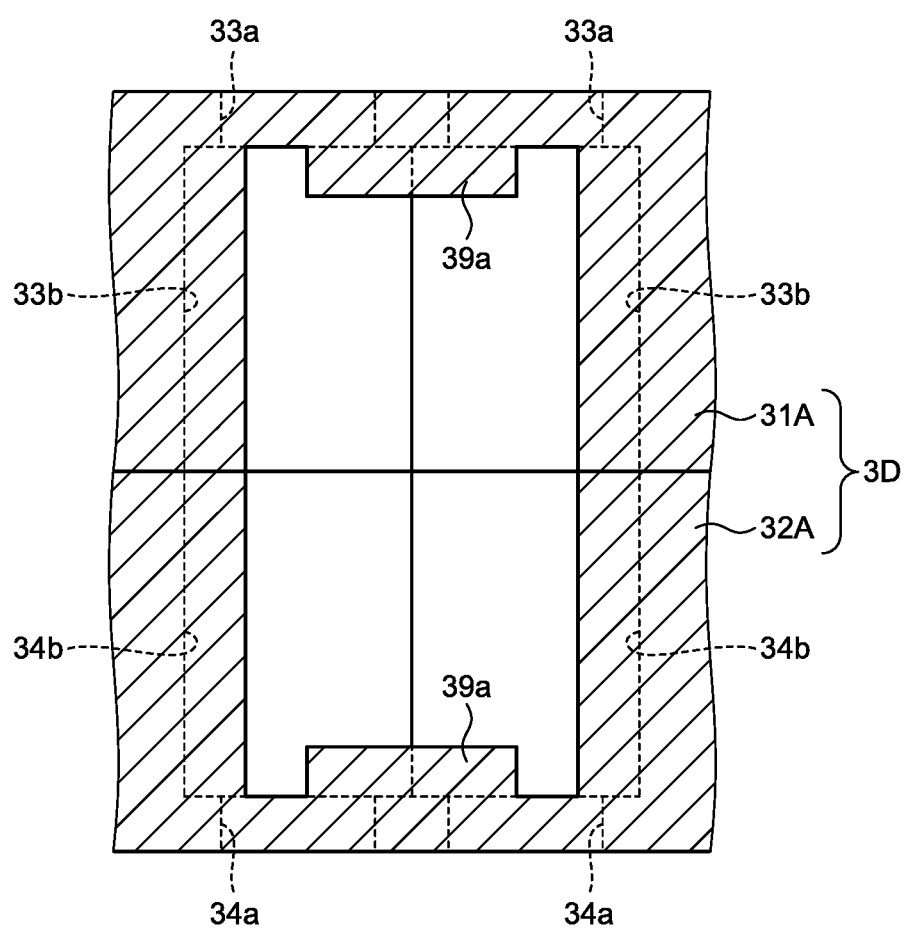
FIG. 14 is a sectional view illustrating a configuration of a probe holder constituting a probe unit according to a second modification of the fifth embodiment of the present invention.

FIG. 14 is a sectional view illustrating a configuration of a probe holder constituting a probe unit according to a second modification of the fifth embodiment of the present invention, and is a sectional view illustrating an A-A line section of FIG. 12. A probe holder 3D according to the second modification includes rhombic columnar portions 39a each obtained by cutting off a part of the rhombic columnar portion 39 described above. The probe holder 3D is laminated with a first member 31A and a second member 32A.

When the holder holes 33 are arranged in a grid pattern and the adjacent large diameter portions 33b contact each other, the rhombic columnar portions 39a each surrounded by four of the large diameter portions 33b are formed in the first member 31A and the second member 32A, as illustrated in FIG. 14. Each of the rhombic columnar portions 39a is formed by cutting off a central part in the axis line direction of the rhombic columnar portion 39 described above. The strength of the holder holes can be improved by configuring the rhombic columnar portions 39a as being provided on only the upper surface side and the lower surface side of the probe holder 3D.

While the configuration examples of correcting the impedance of the signal probe have been described in the first to fifth embodiments described above, the impedance correction can also be applied to the power supply probe.

In the above-described first to fifth embodiments, the inner conductor has been described to be formed by the first and second plungers and the coil spring. However, the inner conductor may be formed by a configuration different from the first and second plungers and the coil spring if the configuration has a stepped shape abutting on the stepped portion formed by the pipe member and the collar and is expandable and contractible along a longitudinal direction.

In the above-described first to fifth embodiments, the pipe member has been described to have a cylindrical shape and have a circular ring shape when viewed from a direction orthogonal to the longitudinal direction. However, the pipe member may have a hollow angular shape.

In the above-described first to fifth embodiments, when the signal input/output is not performed through the pipe member, that is, when the first and second plungers and the coil spring are used as a conducting path, an insulating material can be used to make the collars.

In the above-described first to fifth embodiments, the plating layers (the inner circumferential platings 642 and 742, the outer circumferential platings 643 and 743, and the platings 646) have been described to be formed on the surfaces of the pipe members (the first pipe members 64 and 64A, and the second pipe member 74). However, a configuration including no plating layer may be employed depending on the mode of fixing the pipe members to the holder holes and the mode of fixing the collars (in the case of the fourth embodiment, the mode of fixing the insulating pipes) to the pipe members. For example, a configuration including no plating layer may be employed when the collars are press-fitted into the pipe members to fix the collars into the pipe members.

When the signal probe transmits a signal other than a radio frequency (RF) signal, the configuration of the power supply probe may be applied to the signal probe.

As described above, the present invention can include various embodiments and the like not described herein, and various design changes and: the like can be made within a scope not departing from the technical idea specified by the claims.

INDUSTRIAL APPLICABILITY

As described above, the contact probe and the probe unit according to the present invention are suitable for simplifying the configuration of the probe holder in which the arrangement of the contact probes is changeable.

REFERENCE SIGNS LIST

1 Semiconductor integrated circuit (IC)
2 Circuit substrate
3, 3A, 3B, 3C, 3D Probe holder
4 Probe
6 Signal probe
7 Power supply probe
8 Grounding probe
31, 31A First member
32, 32A Second member
33, 34, 37, 38 Holder hole
35 Holder substrate
36 Insulating substrate
39, 39a Rhombic columnar portion
61, 71, 81 First plunger
62, 72, 82 Second plunger
63, 73, 83 Coil spring
64, 64A First pipe member
74 Second pipe member
84 Third pipe member
65, 75, 85 Collar
300, 310, 320, 330 Cap
641 Impedance correction member
642, 742 Inner circumferential plating
643, 743 Outer circumferential plating
741 Insulating member

The invention claimed is:

1. A probe unit comprising:
a signal probe configured to receive and output a signal from and to a predetermined circuit structure;
a power supply probe configured to supply power to the predetermined circuit structure;
a grounding probe configured to supply a ground potential to the predetermined circuit structure; and
a conductive probe holder including a plurality of hole portions in which the signal probe, the power supply probe, and the grounding probe are insertable, the plurality of hole portions having a same hole shape as one another, wherein
each of the signal probe, the power supply probe, and the grounding probe includes:
a cylindrical pipe member;
a collar including a hollow portion and fixed to an inner circumferential side of at least one end in a longitudinal direction of the pipe member; and
an inner conductor including a flange configured to abut on a stepped portion formed by the pipe member and the collar, the inner conductor being expandable and contractible along the longitudinal direction and penetrating the pipe member,
an outermost diameter of the inner conductor of the signal probe is different from an outermost diameter of the inner conductor of at least one of the power supply probe and the grounding probe,
a thickness of the pipe member of the signal probe is different from a thickness of the pipe member of at least one of the power supply probe and the grounding probe, and
the pipe members of the probes have a same outer diameter,
wherein the cylindrical pipe member of the signal probe is formed of a dielectric material having a predetermined dielectric constant and configured to correct characteristic impedance of the signal probe by adjusting the predetermined dielectric constant and an outer diameter of a cylindrical shape of the cylindrical pipe member.

2. The probe unit according to claim 1, wherein
adjacent ones of the hole portions of the probe holder communicate with each other at portions thereof,
at least an outer circumferential surface of the pipe member is conductive, and
the pipe members of the probes penetrating the adjacent hole portions contact each other at the portions where the hole portions communicate with each other.

3. The probe unit according to claim 1, wherein
the outermost diameter of the inner conductor of the signal probe is different from the outermost diameter of the inner conductor of the grounding probe,
the thickness of the pipe member of the signal probe is different from the thickness of the pipe member of the grounding probe.

4. The probe unit according to claim 1, wherein
the pipe member of each of the signal probe and the power supply probe includes an insulating pipe made of an insulating material, and
the pipe member of the grounding probe is made of a conductive material.

5. The probe unit according to claim 4, wherein the pipe member of each of the signal probe and the power supply probe further includes conductive coating layers provided on an inner circumference and an outer circumference of the insulating pipe.

6. The probe unit according to claim 1, wherein the pipe member includes:
an outer circumferential pipe and an inner circumferential pipe forming a double-pipe structure; and
insulating members provided between the outer circumferential pipe and the inner circumferential pipe at both ends in an axial direction of the pipe member, and
an air layer is formed by the outer circumferential pipe, the inner circumferential pipe, and the insulating members.

7. The probe unit according to claim 1, wherein the collar is made of a conductive material.

8. The probe unit according to claim 1, wherein an another collar is provided at another end of the pipe member.

* * * * *